US008854864B2

(12) United States Patent
Wei et al.

(10) Patent No.: US 8,854,864 B2
(45) Date of Patent: Oct. 7, 2014

(54) NONVOLATILE MEMORY ELEMENT AND NONVOLATILE MEMORY DEVICE

(71) Applicant: Panasonic Corporation, Osaka (JP)

(72) Inventors: Zhiqiang Wei, Osaka (JP); Takeki Ninomiya, Osaka (JP); Takeshi Takagi, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/982,398

(22) PCT Filed: Nov. 8, 2012

(86) PCT No.: PCT/JP2012/007162
§ 371 (c)(1),
(2), (4) Date: Jul. 29, 2013

(87) PCT Pub. No.: WO2013/080452
PCT Pub. Date: Jun. 6, 2013

(65) Prior Publication Data
US 2014/0050013 A1    Feb. 20, 2014

(30) Foreign Application Priority Data

Dec. 2, 2011    (JP) ................................. 2011-264799

(51) Int. Cl.
*G11C 11/00*    (2006.01)
*H01L 45/00*    (2006.01)
*G11C 13/00*    (2006.01)
*H01L 27/24*    (2006.01)

(52) U.S. Cl.
CPC .......... *H01L 45/145* (2013.01); *G11C 13/0007* (2013.01); *H01L 45/08* (2013.01); *H01L 45/1233* (2013.01); *H01L 45/146* (2013.01); *H01L 27/2436* (2013.01); *G11C 13/0002* (2013.01); *H01L 27/2463* (2013.01)
USPC .............. 365/148; 365/129; 365/100; 365/46

(58) Field of Classification Search
CPC ... H01L 45/08; H01L 45/146; H01L 45/1233; G11C 13/0007; G11C 13/0002
USPC ..................................... 365/148, 129, 100, 46
See application file for complete search history.

(56) References Cited

U.S. PATENT DOCUMENTS 6,473,332 B1    10/2002    Ignatiev et al.
7,796,416 B2 *    9/2010    Ishihara et al. ............... 365/148

(Continued)

FOREIGN PATENT DOCUMENTS

| JP | 2008-306157 | 12/2008 |
| JP | 2010-251352 | 11/2010 |

(Continued)

OTHER PUBLICATIONS

International Search Report mailed Feb. 12, 2013 in International (PCT) Application No. PCT/JP2012/007162.

(Continued)

*Primary Examiner* — Viet Q Nguyen
(74) *Attorney, Agent, or Firm* — Wenderoth, Lind & Ponack, LLP

(57) ABSTRACT

A nonvolatile memory element includes: a first electrode; a second electrode; and a variable resistance layer comprising a metal oxide positioned between the first electrode and the second electrode. The variable resistance layer includes: a first oxide layer having a resistivity $\rho_x$, on the first electrode; a second oxide layer having a resistivity $\rho_y$ ($\rho_x < \rho_y$), on the first oxide layer; a third oxide layer having a resistivity $\rho_z$ ($\rho_y < \rho_z$), on the second oxide layer; and a localized region that is positioned in the third oxide layer and the second oxide layer to be in contact with the second electrode and not to be in contact with the first oxide layer, and is, in resistivity, lower than the third oxide layer and different from the second oxide layer.

16 Claims, 17 Drawing Sheets

(56) References Cited

U.S. PATENT DOCUMENTS

| | | | |
|---|---|---|---|
| 8,054,674 B2 * | 11/2011 | Tamai et al. | 365/148 |
| 8,264,865 B2 * | 9/2012 | Mitani et al. | 365/148 |
| 8,437,173 B2 * | 5/2013 | Hayakawa et al. | 365/148 |
| 8,686,386 B2 * | 4/2014 | Tendulkar et al. | 257/2 |
| 2010/0172170 A1 | 7/2010 | Tamai et al. | |
| 2010/0308298 A1 | 12/2010 | Ninomiya et al. | |
| 2012/0147650 A1 * | 6/2012 | Samachisa et al. | 365/51 |
| 2012/0230085 A1 | 9/2012 | Kawai et al. | |
| 2013/0001504 A1 | 1/2013 | Ninomiya et al. | |
| 2013/0149815 A1 * | 6/2013 | Murase et al. | 438/104 |
| 2013/0223133 A1 * | 8/2013 | Azuma et al. | 365/148 |
| 2014/0092671 A1 * | 4/2014 | Azuma et al. | 365/148 |
| 2014/0117305 A1 * | 5/2014 | Yasuhara et al. | 257/4 |

FOREIGN PATENT DOCUMENTS

| | | |
|---|---|---|
| WO | 2010/038423 | 4/2010 |
| WO | 2012/042866 | 4/2012 |
| WO | 2012/066787 | 5/2012 |

OTHER PUBLICATIONS

R. Waser et al., "Redox-Based Resistive Switching Memories—Nanoionic Mechanisms, Prospects, and Challenges", Advanced Materials, vol. 21, No. 25-26, pp. 2632-2663, Jul. 2009.

* cited by examiner

NONVOLATILE MEMORY ELEMENT AND NONVOLATILE MEMORY DEVICE

TECHNICAL FIELD

The present invention relates to nonvolatile memory elements, and particularly to a variable resistance nonvolatile memory element having a resistance value that reversibly changes in response to an applied electrical signal and to a nonvolatile memory device including the nonvolatile memory element.

BACKGROUND ART

In recent years, with the advances in digital technologies employed for electrical apparatuses, large-capacity and nonvolatile memory devices for storing data, such as music, images, and information, are in increasing demand. As one of the measures to respond to such a demand, a nonvolatile memory device which includes, as a memory cell, a nonvolatile memory element having a resistance value that changes in response to a given electrical signal and keeps the resulting state (referred to as the "ReRAM" hereafter) has received attention. Examples of the reasons for the attention include that the configuration of the nonvolatile memory element is relatively simple and thus implemented easily at a high density, and that consistency with a conventional semiconductor process can be easily ensured.

Such a nonvolatile memory element is classified roughly into two kinds according to a material used for a variable resistance layer (a variable resistance material). One kind is a variable resistance nonvolatile memory element in which a perovskite material (such as $Pr_{1-x}Ca_xMnO_3$ (PCMO), $La_{1-x}Sr_xMnO_3$(LSMO), or $GdBaCo_xO_y$ (GBCO)) disclosed in, for example, Patent Literature 1 is used as the variable resistance material.

The other kind is a variable resistance nonvolatile memory element which uses a binary metal oxide as the variable resistance material. As compared with the aforementioned perovskite material, the composition and structure of the binary metal oxide are extremely simple. On this account, the composition control and film formation at the time of manufacturing can be easily implemented. In addition, because of the advantage of relatively excellent consistency with the semiconductor manufacturing process, a great deal of research have been conducted.

The physical mechanism of a resistance change is still unknown in many respects. However, through the recent research, change in the defect density of conductive filaments formed in the binary metal oxide by oxidation-reduction is regarded as the most likely factor responsible for a resistance change (see Patent Literature 2 and Non Patent Literature 1, for example).

FIG. 19 is a cross-sectional diagram showing a configuration of a conventional nonvolatile memory element 1800 disclosed in Patent Literature 2.

By the application of a voltage (an initial breakdown voltage) between a first electrode 1803 and a second electrode 1806 in an archetypal structure ((a) of FIG. 19) where a variable resistance layer 1805 comprising a metal oxide is positioned between the first electrode 1803 and the second electrode 1806, filaments 1805c are formed ((b) of FIG. 19) to be a current path between the first electrode 1803 and the second electrode 1806 (in the current path, the current flowing between the first electrode 1803 and the second electrode 1806 is locally high in density).

CITATION LIST

Patent Literature

[PTL 1]
The specification of U.S. Pat. No. 6,473,332
[PLT 2]
Japanese Unexamined Patent Application Publication No. 2008-306157

Non Patent Literature

[NPL 1]
R. Waser et al., Advanced Materials, NO21, 2009, pp. 2632-2663

SUMMARY OF INVENTION

Technical Problem

It is desirable to reduce fluctuations in the variable resistance characteristics of the aforementioned conventional nonvolatile memory element that includes the metal oxide as the variable resistance material. Here, after studying diligently, the present inventors found that the conventional variable resistance element had the following problem.

The conventional nonvolatile memory element comprising a metal oxide can change in resistance after the filaments are formed in the variable resistance layer by the application of the initial breakdown voltage. Here, the filaments formed in the variable resistance layer pass through the variable resistance layer to connect the first electrode and the second electrode. In the variable resistance element including such filaments, the resistance value of the variable resistance layer fluctuates greatly by the resistance change, resulting in great fluctuations in the variable resistance characteristics.

The present invention is conceived to solve the aforementioned problem, and has an object to provide a nonvolatile memory element having less fluctuations in the variable resistance characteristics and a nonvolatile memory device.

Solution to Problem

In order to solve the conventional problem, a variable resistance nonvolatile memory element in an aspect according to the present invention includes: a first electrode; a second electrode; and a variable resistance layer which comprises a metal oxide positioned between the first electrode and the second electrode, the metal oxide having a resistance state that reversibly changes between a high resistance state and a low resistance state according to a polarity of a voltage pulse applied between the first electrode and the second electrode, wherein the variable resistance layer includes: a first metal oxide layer which is positioned on the first electrode, and has a resistivity $\rho_x$ and a composition that is expressed by $MO_x$ where M represents a metal element; a second metal oxide layer which is positioned on the first metal oxide layer, and has a resistivity $\rho_y$, where $\rho_x < \rho_y$, and a composition expressed by $NO_y$, where N represents a metal element; a third metal oxide layer which is positioned on the second metal oxide layer, and has a resistivity $\rho_y$ where $\rho_y < \rho_z$ and a composition expressed by $PO_z$ where P represents a metal element; and a localized region which is positioned in the third metal oxide layer and the second metal oxide layer to be in contact with the second electrode and not to be in contact with the first metal oxide layer, and has a resistivity that is lower than the resistivity of the third metal oxide layer and different from the resistivity of the second metal oxide layer.

Advantageous Effects of Invention

According to the present invention, a nonvolatile memory element having less fluctuations in the variable resistance characteristics can be obtained by controlling the length of a localized region.

DESCRIPTION OF EMBODIMENTS

Figure 1:
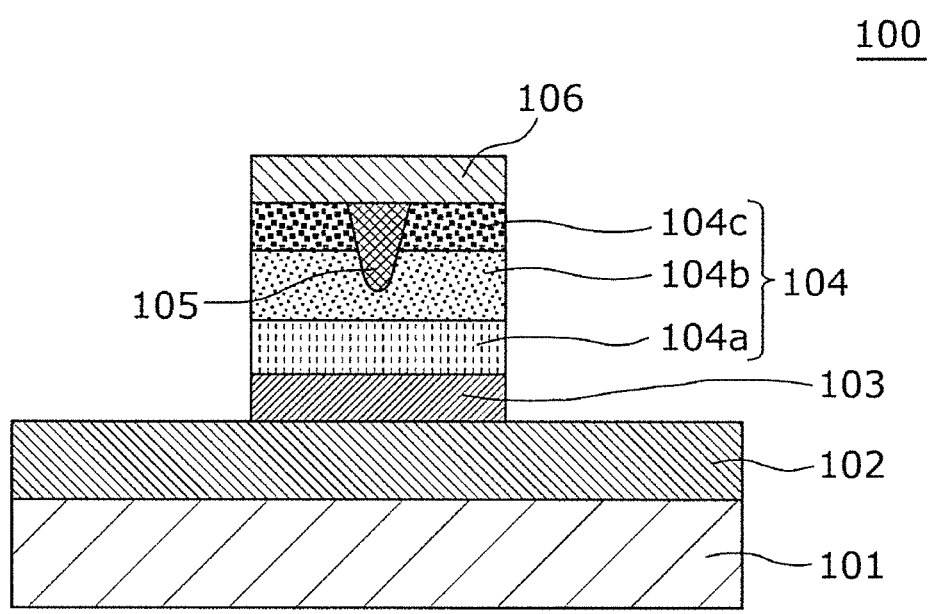
FIG. 1 is a cross-sectional diagram showing a nonvolatile memory element in Embodiment 1 according to the present invention.

A variable resistance nonvolatile memory element in an aspect according to the present invention includes: a first electrode; a second electrode; and a variable resistance layer which comprises a metal oxide positioned between the first electrode and the second electrode, the metal oxide having a resistance state that reversibly changes between a high resistance state and a low resistance state according to a polarity of a voltage pulse applied between the first electrode and the second electrode, wherein the variable resistance layer includes: a first metal oxide layer which is positioned on the first electrode, and has a resistivity $\rho_x$ and a composition that is expressed by $MO_x$ where M represents a metal element; a second metal oxide layer which is positioned on the first metal oxide layer, and has a resistivity $\rho_y$ where $\rho_x < \rho_y$ and a composition expressed by $NO_y$ where N represents a metal element; a third metal oxide layer which is positioned on the second metal oxide layer, and has a resistivity $\rho_z$ where $\rho_y < \rho_z$ and a composition expressed by $PO_z$ where P represents a metal element; and a localized region which is positioned in the third metal oxide layer and the second metal oxide layer to be in contact with the second electrode and not to be in contact with the first metal oxide layer, and has a resistivity that is lower than the resistivity of the third metal oxide layer and different from the resistivity of the second metal oxide layer.

With this configuration where the localized region is smaller than the thickness of the variable resistance layer and thus electric field concentration occurs, the resistance can be changed by the application of a low voltage. Moreover, since the localized region is not in contact with the first electrode, a resistance change in parasitic resistance resulting from the influence of the first electrode can be reduced, thereby reducing the fluctuations in the variable resistance characteristics. In addition, the length of the localized region can be controlled by the second metal oxide layer, thereby reducing the change in resistance resulting from the fluctuations in the length of the localized region. Accordingly, the fluctuations in the variable resistance characteristics can be further reduced.

Here, the first metal oxide layer, the second metal oxide layer, and the third metal oxide layer may comprise metal oxides of the same kind.

With this configuration, when the variable resistance layer is formed by reactive sputtering in an oxygen atmosphere, each metal oxide layer of the variable resistance layer can be formed by adjusting the oxygen partial pressure. Thus, the process can be simplified.

Moreover, the first metal oxide layer, the second metal oxide layer, and the third metal oxide layer may comprise metal oxides of different kinds.

With this configuration, the variable resistance layer can be configured with a stacked structure of metal oxide layers having different band gaps. This allows the operating voltage of the nonvolatile memory element to be lowered.

Furthermore, each metal oxide included in the third metal oxide layer, the second metal oxide layer, and the first metal oxide layer may comprise an element selected from a group including tantalum, hafnium, zirconium, and aluminum.

Moreover, the first electrode and the second electrode may comprise the same material.

Furthermore, the variable resistance nonvolatile memory element may further include a load element which is electrically connected to the variable resistance layer.

Moreover, the load element may be one of a fixed resistor, a transistor, and a diode.

Furthermore, the localized region may be formed in the variable resistance layer on a one-to-one basis.

Moreover, a nonvolatile memory device in an aspect according to the present invention includes: a memory cell array including (i) a substrate, (ii) first lines which are formed in parallel to each other on the substrate, (iii) second lines which are formed in parallel to each other on a plane parallel to a main plane of the substrate, and are positioned above the first lines to three-dimensionally cross the first lines, and (iv) a plurality of the aforementioned nonvolatile memory elements arranged at three-dimensional cross-points of the first lines and the second lines; a selection circuit which selects at least one of the nonvolatile memory elements included in the memory cell array; a write circuit which writes data by applying a voltage to the nonvolatile memory element selected by the selection circuit; and a read circuit which reads data by detecting a resistance value of the nonvolatile memory element selected by the selection circuit.

With this configuration, the fluctuations in the variable resistance characteristics can be reduced.

Here, the nonvolatile memory element may include a current steering element which is electrically connected to the variable resistance layer.

Furthermore, a nonvolatile memory device in an aspect according to the present invention includes: a memory cell array including (i) a substrate, (ii) word lines and bit lines which are formed on the substrate, (iii) transistors each of which is connected to a corresponding one of the word lines and to a corresponding one of the bit lines; and (iv) a plurality of the aforementioned nonvolatile memory elements provided for the transistors on a one-to-one basis; a selection circuit which selects at least one of the nonvolatile memory elements included in the memory cell array; a write circuit which writes data by applying a voltage to the nonvolatile memory element selected by the selection circuit; and a read circuit which reads data by detecting a resistance value of the nonvolatile memory element selected by the selection circuit.

With this configuration, the fluctuations in the variable resistance characteristics can be reduced.

The following is a description of Embodiments according to the present invention, with reference to the drawings.

It should be noted that, in the drawings, structural elements presenting substantially identical configurations, operations, and effects are assigned the same reference sign and that explanations of these identical structural elements may not be repeated. Moreover, all the numerical values, materials, film formation methods described below are merely examples to explain Embodiments in the present invention in concrete terms, and the present invention is not limited to these examples. Furthermore, the relations of connection between the structural elements described below to implement the functions according to the present invention are merely examples to explain Embodiments in the present invention in concrete terms, and the relation of connection to implement the function according to the present invention is not limited to these examples. Moreover, the present invention is determined only by the scope of the appended Claims. Thus, among the structural elements in Embodiments below, structural elements not recited in any one of the independent claims indicating top concepts according to the present invention are not necessarily required to achieve the object in the present invention. However, these structural elements are described to implement a more preferred embodiment.

[Embodiment 1]

[Configuration of Nonvolatile Memory Element]

FIG. 1 is a cross-sectional diagram showing an example of a configuration of a nonvolatile memory element in Embodiment 1 according to the present invention.

A nonvolatile memory element 100 in Embodiment 1 includes a substrate 101, an interlayer dielectric 102 formed on the substrate 101, a first electrode 103 formed on the interlayer dielectric 102, a second electrode 106, a variable resistance layer 104 positioned between the first electrode 103 and the second electrode 106.

The variable resistance layer 104 comprises an oxide of a metal (a metal oxide) positioned between the first electrode 103 and the second electrode 106, and has a resistance value that reversibly changes in response to an electrical signal applied between the first electrode 103 and the second electrode 106. For example, the variable resistance layer 104 comprises the metal oxide having a resistance state that reversibly changes between a high resistance state and a low resistance state according to the polarity of a voltage pulse applied between the first electrode 103 and the second electrode 106.

Here, the variable resistance layer 104 includes: a first oxide layer 104a that is positioned on the first electrode 103, has a resistivity $\rho_x$ and a composition expressed by $MO_x$ (where M represents a metal element), and is connected to the first electrode 103; a second oxide layer 104b that is formed (positioned) on the first oxide layer 104a, and has a resistivity $\rho_y$ (where $\rho_x < \rho_y$) and a composition expressed by $NO_y$ (where N represents a metal element); a third oxide layer 104c that is formed (positioned) on the second oxide layer 104b, has a resistivity $\rho_z$ (where $\rho_y < \rho_z$) and a composition expressed by $PO_z$ (where P represents a metal element), and is connected to the second electrode 106; and a localized region 105 that is positioned in the second oxide layer 104b and the third oxide layer 104c to be in contact with the second electrode 106 and not to be in contact with the first oxide layer 104a, and has a resistivity that is lower than the resistivity of the third oxide layer 104c and different from the resistivity of the second oxide layer 104b. The localized region 105 comprises an oxide of a metal including the metal element P that is the same as included in the third oxide layer 104c. The localized region 105 reversibly changes in the oxygen deficiency level in response to the application of a voltage pulse. For example, the localized region 105 comprises an oxide of a metal including the metal element P that is the same as included in the third oxide layer 104c and the metal element N that is the same as included in the second oxide layer 104b. It should be noted that a "metal oxide layer" may be simply referred to as an "oxide layer" hereafter for the sake of simplicity.

The variable resistance layer 104 has a stacked structure including the first oxide layer 104a, the second oxide layer 104b, and the third oxide layer 104c. The first oxide layer 104a includes a first metal oxide. The second oxide layer 104b includes a second metal oxide. The third oxide layer 104c includes a third metal oxide. Moreover, a relationship among the resistivity $\rho_x$ of the first oxide layer 104a, the resistivity $\rho_y$ of the second oxide layer 104b, and the resistivity $\rho_z$ of the third oxide layer 104c is expressed by $\rho_x < \rho_y < \rho_z$. Furthermore, when the resistivity of the localized region 105 is represented as $\rho_l$, the localized region 105 includes a region where $\rho_l < \rho_z$ and a region where $\rho_l \neq \rho_y$.

In other words, the variable resistance layer 104 includes a stacked structure configured by stacking at least three layers which are the first oxide layer 104a including the first metal oxide, the second oxide layer 104b including the second metal oxide, and the third oxide layer 104c including the third metal oxide. The first oxide layer 104a is positioned between the first electrode 103 and the second oxide layer 104b. The second oxide layer 104b is positioned between the first oxide layer 104a and the third oxide layer 104c. The third oxide layer 104c is positioned between the second oxide layer 104b and the second electrode 106. The third oxide layer 104c may be thinner than the first oxide layer 104a and the second oxide layer 104b in thickness. In this case, a structure where the localized region 105 described later is not in contact with the first oxide layer 104a can be easily formed. The third oxide layer 104c is higher in resistivity than the first oxide layer 104a and the second oxide layer 104b. Therefore, an electric field applied to the variable resistance layer 104 is likely to concentrate on the third oxide layer 104c. Moreover, the second oxide layer 104b is higher in resistivity than the first oxide layer 104a. On this account, in the case where the localized region 105 is formed in the third oxide layer 104c, the resistance value of the third oxide layer 104c is reduced and the electric field is concentrated on the second oxide layer 104b during the process of forming the localized region 105. Then, by a reduction in the voltage applied to the third oxide layer 104c, the localized region 105 stops growing and eventually remains in the second oxide layer 104b.

Since the resistivity of the first oxide layer 104a is low, a voltage is hardly present in the interfacial surface between the first oxide layer and the first electrode 103 during the resistance change operation. Thus, no change occurs to the parasitic resistance of the interfacial surface between the first oxide layer 104a and the first electrode 103.

The localized region 105 can be formed by the application of an initial breakdown voltage to the variable resistance layer 104 having the stacked structure including the first oxide layer 104a, the second oxide layer 104b, and the third oxide layer 104c. As described later, the initial breakdown voltage may be low at this time. With the application of the initial breakdown at the low voltage, the localized region 105 is formed which is in contact with the second electrode 106, passes through the third oxide layer 104c, and partly enters the second oxide layer 104b not to be in contact with the first oxide layer 104a.

In the present specification, the localized region refers to a region which is included in the variable resistance layer 104 and in which a current dominantly flows when a voltage is applied between the first electrode 103 and the second electrode 106. It should be noted that the localized region 105 refers to a region including a group of filaments (conductive paths) comprising an oxygen defect site formed in the variable resistance layer 104. To be more specific, a resistance change occurs to the variable resistance layer 104 via the localized region 105. For this reason, when a driving voltage is applied to the variable resistance layer 104 in the low resistance state, the current dominantly flows in the localized region 105 including the filaments. The variable resistance layer 104 changes the state between the high resistance state and the low resistance state in the localized region 105.

The size of the localized region 105 may be small as long as the lower end of the localized region 105 is not in contact with the first oxide layer 104a. With the reduction in the size of the localized region 105, the fluctuations in the resistance change are reduced. However, the localized region 105 needs to be large enough to secure the filaments (the conductive paths) required to at least pass a current.

Only one localized region 105 may be formed in one variable resistance layer 104 included in the nonvolatile memory element 100. With this, the fluctuations in the resistance value of the nonvolatile memory element 100 can be reduced. It should be noted that the number of the localized regions 105 formed in the variable resistance layer 104 can be verified by, for example, electron beam absorbed current (EBAC) analysis.

A resistance change phenomenon of the variable resistance layer 104 having the stacked structure is assumed to occur when an oxidation-reduction reaction takes place in the tiny localized region 105 and the filaments in the localized region 105 accordingly change and thereby change in the resistance value.

To be more specific, when a positive voltage with respect to the first electrode 103 is applied to the second electrode 106, oxygen ions included in the variable resistance layer 104 are pulled to the side of the third oxide layer 104c. Then, an oxidation reaction occurs in the tiny localized region 105 and thus the oxygen deficiency level decreases. As a result, it is assumed that the filaments in the localized region 105 become hard to be linked together and that the resistance value accordingly increases.

On the other hand, when a negative voltage with respect to the first electrode 103 is applied to the second electrode 106, oxygen ions included in the third oxide layer 104c are pushed to the side of the second oxide layer 104b. Then, a reduction reaction occurs in the tiny localized region 105 and the oxygen deficiency level increases. As a result, it is assumed that the filaments in the localized region 105 become easy to be linked to each other and that the resistance value accordingly deceases.

When this nonvolatile memory element 100 is to be driven, a voltage satisfying a predetermined condition is applied between the first electrode 103 and the second electrode 106 from an external power supply. In response to the voltage value and polarity of the applied voltage, the resistance value of the variable resistance layer 104 of the nonvolatile memory element 100 reversibly increases or decreases. For example, when a pulse voltage that has a predetermined polarity and is larger in amplitude than a predetermined threshold voltage is applied, the resistance value of the variable resistance layer 104 increases or decreases. Hereafter, such a voltage may be referred to as the "write voltage". On the other hand, when a pulse voltage that is smaller in amplitude than the threshold voltage is applied, the resistance value of the variable resistance layer 104 does not change. Hereafter, such a voltage may be referred to as the "read voltage".

The variable resistance layer 104 comprises a metal oxide having a non-stoichiometric composition. The metal oxide having the non-stoichiometric composition is classified into an oxygen-deficient oxide, a metal-rich oxide, an oxygen-rich oxide, or a metal-deficient oxide, and adheres to the definition described by Yasutoshi Saito et al. in "Kinzoku Sankabutu no Nonsutoikiometori to Denki Dendo" published by Uchida Rokakuho, pp. 92 to 94. As the base metal of the metal oxide, at least one of the following may be selected: transition metals, such as tantalum (Ta), hafnium (Hf), titanium (Ti), zirconium (Zr), niobium (Nb), tungsten (W), nickel (Ni), and iron (Fe); and metals such as aluminum (Al). In other words, each of the metal oxides included in the third oxide layer 104c, the second oxide layer 104b, and the first oxide layer 104a may comprise an element selected from a group including the transition metals such as tantalum, hafnium, titanium, zirconium, niobium, tungsten, nickel, and iron and the metals such as aluminum. When the variable resistance 104 comprising the metal oxide having the non-stoichiometric composition is included, the nonvolatile memory element 100 can implement the resistance change operation that is excellent in the reproducibility and is stable.

The transition metal can take different oxidized states, and thus can implement different resistance states by oxidation-reduction reactions.

For example, suppose that a hafnium oxide is used, that a composition of the second metal oxide is expressed by $HfO_y$, and that a composition of the third metal oxide is expressed by $HfO_z$. In this case, when "y" is 0.9 to 1.6 and "z" is greater than y, the resistance value of the variable resistance layer 104 can be changed stably at high speed. Here, the thickness of the third oxide metal oxide may be 3 nm to 4 nm.

Moreover, suppose that a zirconium oxide is used, that a composition of the second metal oxide is expressed by $ZrO_y$, and that a composition of the third metal oxide is expressed by $ZrO_z$. In this case, when y is 0.9 to 1.4 and z is greater than y, the resistance value of the variable resistance layer 104 can be changed stably at high speed. Here, the thickness of the third metal oxide may be 1 nm to 5 nm.

Suppose that all of the first oxide layer 104a, the second oxide layer 104b, and the third oxide layer 104c include the same kind of metal oxide. In this case, the relationship among the resistivity $\rho_x$ of the first oxide layer 104a, the resistivity $\rho_y$ of the second oxide layer 104b, and the resistivity $\rho_z$ of the third oxide layer 104c can satisfy $\rho_x < \rho_y < \rho_z$ by an adjustment to the oxygen content atomic percentage. For example, the first oxide layer 104 can comprise the first metal oxide that is oxygen deficient. Moreover, the second oxide layer 104b can comprise the second metal oxide that is lower in the oxygen deficiency level than the first metal oxide. Furthermore, the third oxide layer 104c can comprise the third metal oxide that is lower in the oxygen deficiency level than the second metal oxide.

Here, the "oxygen deficiency level" refers to the ratio of deficient oxygen to the amount of oxygen included in the oxide of the stoichiometric composition (having the highest resistance value in the case where a plurality of stoichiometric compositions are present) of the corresponding metal oxide. The metal oxide having the stoichiometric composition has a more stable and higher resistance value as compared with a metal oxide having a different composition.

For example, when the metal is tantalum (Ta), the oxide having the stoichiometric composition based on the above definition is $Ta_2O_5$ and thus can be expressed by $TaO_{2.5}$. The oxygen deficiency level of $TaO_{2.5}$ is 0%, and the oxygen deficiency level of $TaO_{1.5}$ is calculated as (2.5-1.5)/2.5=40%. Here, the oxygen deficiency level of an oxygen-rich metal oxide is a negative value. Unless otherwise specified, the present specification describes the oxygen deficiency level, assuming that each of a positive value, 0, and a negative value may represent the oxygen deficiency level.

The oxide having a low oxygen deficiency level has a higher resistance value since the oxide is closer to an oxide having a stoichiometric composition. The oxide having a higher oxygen deficiency level has a lower resistance value since the oxide is closer to the metal included in the oxide.

Here, the "oxygen content atomic percentage" refers to the percentage of oxygen atoms of the total number of atoms. For example, the oxygen content atomic percentage of $Ta_2O_5$ is the percentage of oxygen atoms of the total number of atoms (i.e., O/(Ta+O)), and thus is 71.4 atm %. Therefore, the oxygen content atomic percentage of the oxygen-deficient tantalum oxide is higher than 0 and lower than 71.4 atm %. For example, when the second metal included in the second oxide layer 104b and the third metal included in the third oxide layer 104c are the same kind, the oxygen content atomic percentage and the oxygen deficiency level have a correlation. To be more specific, when the oxygen content atomic percentage of the third metal oxide is higher than that of the second metal oxide, the oxygen deficiency level of the third metal oxide is lower than that of the second metal oxide.

Figure 2:
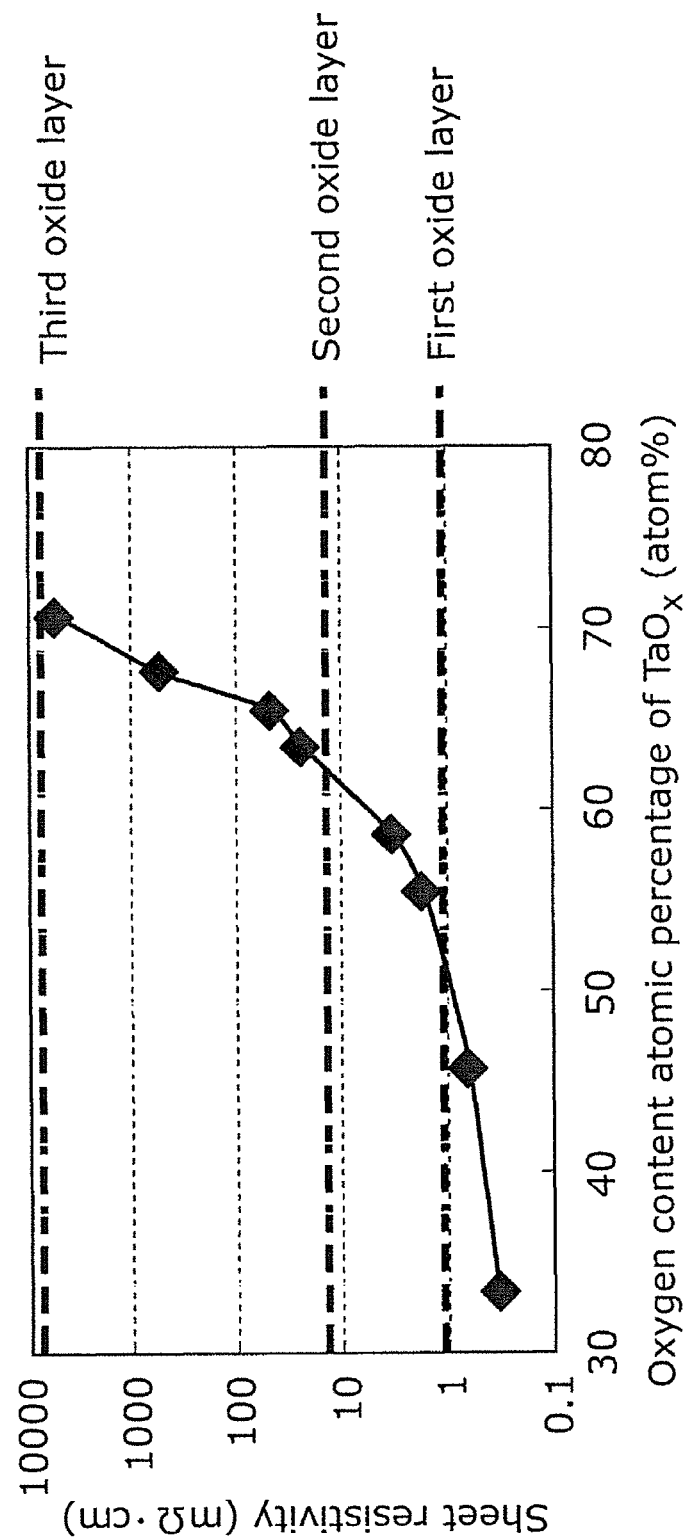
FIG. 2 is a diagram showing a relationship between the oxygen content atomic percentage and the sheet resistivity of a variable resistance layer comprising a tantalum oxide.

FIG. 2 is a diagram showing a relationship between the sheet resistivity and the oxygen content atomic percentage of the variable resistance layer 104 comprising a tantalum oxide.

In FIG. 2, the oxygen content atomic percentages of the oxide layers of the variable resistance layer 104 are: 51% (oxygen deficient) in the first oxide layer 104a; 62% (oxygen deficient) in the second oxide layer 104b; and 72.5% (stoichiometric proportion) in the third oxide layer 104c. By arranging the second oxide layer 104b having the slightly high percentage as the middle layer in order to reduce the slope of the oxygen content atomic percentage in the vertical direction, oxygen diffusion caused by the slope of intensity can be reduced.

Suppose that the first oxide layer 104a is represented by $TaO_x$, that the second oxide layer 104b is represented by $TaO_y$, and that the third oxide layer 104c is represented by $TaO_z$. In this case, in order for the tantalum oxide to implement the resistivity relationship expressed by $\rho_x < \rho_y < \rho z$, $TaO_x$, $TaO_y$, and $TaO_z$ may satisfy the following.

$2.1 \le z$ $0.8 \le y \le 1.9$ $0 < x < 0.8$

Figure 3:
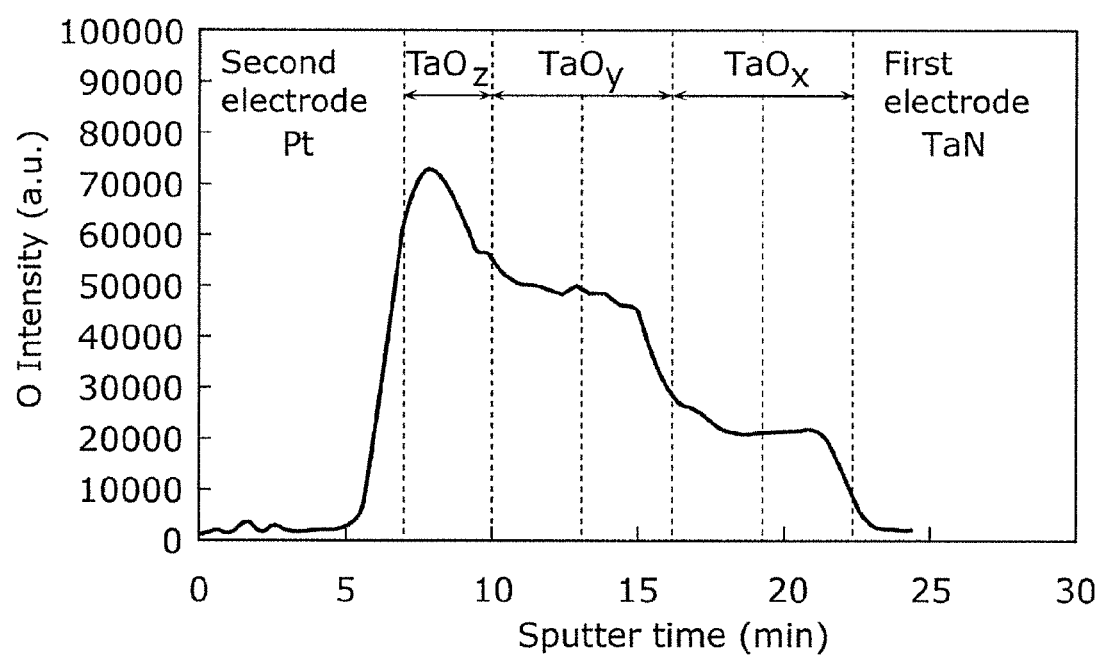
FIG. 3 is a diagram showing an oxygen profile of the variable resistance layer comprising the tantalum oxide.

FIG. 3 is a diagram showing an oxygen profile of the variable resistance layer 104 comprising the tantalum oxide in the nonvolatile memory element 100. To be more specific, FIG. 3 is a graph showing the oxygen profile of the variable resistance layer 104 in the nonvolatile memory element 100, the variable resistance layer 104 including the first oxide layer 104a comprising TaO$_x$, the second oxide layer 104b comprising TaO$_y$, and the third oxide layer 104c comprising TaO$_z$. It should be noted that the total film thickness of the variable resistance layer 104 is 50 nm. One section in the horizontal direction indicated between broken lines in FIG. 3 (the broken lines are illustrated in the vertical direction) corresponds to 10 nm, and thus the film thickness of TaO$_z$ is 10 nm.

The auger electron spectroscopy (AES) analysis is not so high in the precision of resolution at an interfacial region. However, as seen from FIG. 3, the presence of TaO$_z$ as the third oxide layer 104c can be clearly verified, and the third oxide layer 104c can be formed by a reactive sputter method that controls the oxygen flow rate.

Moreover, suppose that the first oxide layer 104a is represented by HfO$_x$, that the second oxide layer 104b is represented by HfO$_y$, and that the third oxide layer 104c is represented by HfO$_z$. In this case, in order for the hafnium oxide to implement the resistivity relationship expressed by $\rho_x < \rho_y < \rho_z$, HfO$_x$, HfO$_y$, and HfO$_z$ may satisfy the following.

$1.8 \leq z$ $0.9 \leq y \leq 1.6$ $0 < x < 0.9$

Furthermore, suppose that the first oxide layer 104a is represented by ZrO$_x$, that the second oxide layer 104b is represented by ZrO$_y$, and that the third oxide layer 104c is represented by ZrO$_z$. In this case, in order for the zirconium oxide to implement the resistivity relationship expressed by $\rho_x < \rho_y < \rho_z$, ZrO$_x$, ZrO$_y$, and ZrO$_z$ may satisfy the following.

$1.9 \leq z$ $0.9 \leq y \leq 1.4$ $0 < x < 0.9$

With this, the fluctuations in the length (depth) of the localized region 105 can be reliably reduced and a stable operation of the device can be implemented.

It should be noted that the first oxide layer 104a, the second oxide layer 104b, and the third oxide layer 104c may comprise metal oxides of different kinds (i.e., each of the metal oxides includes a different metal element).

In this case, the third metal oxide included in the third oxide layer 104c may be lower in the oxygen deficiency level, that is, higher in resistance, than the second metal oxide included in the second oxide layer 104b. With such a configuration, the voltage applied between the first electrode 103 and the second electrode 106 for a resistance change is distributed more to the third metal oxide. This allows an oxidation-reduction reaction to occur more easily in the third metal oxide.

Moreover, when a different material is used for each of the second metal included in the second metal oxide and the third metal included in the third metal oxide, a standard electrode potential of the third metal may be lower than a standard electrode potential of the second metal. When the standard electrode potential is higher, this material is less oxidizable. Therefore, it is easier for an oxidation-reduction reaction to occur in the third metal oxide which is relatively low in the standard electrode potential.

For example, a stable resistance change operation can be implemented, by using an oxygen-deficient tantalum oxide (TaO$_x$) for the second metal oxide and using a titanium oxide (TiO$_2$) is used for the third metal oxide. Titanium (the standard electrode potential=−1.63 eV) is a material that is lower in the standard electrode potential than tantalum (the standard electrode potential=−0.6 eV).

In this way, when the metal oxide having a standard electrode potential lower than the standard electrode potential of the second metal oxide is used for the third metal oxide, it is easier for an oxidation-reduction reaction to occur in the third metal oxide. As another combination, an aluminum oxide (Al$_2$O$_3$) may be used for the third metal oxide that is the high-resistance layer. For example, an oxygen-deficient tantalum oxide (TaO$_x$) may be used for the second metal oxide and an aluminum oxide (Al$_2$O$_3$) may be used for the third metal oxide.

Furthermore, the third oxide layer 104c, the second oxide layer 104b, and the first oxide layer 104a may comprise metal oxides of the same kind (i.e., the metal oxides include the same metal element).

Moreover, the second oxide layer 104b and the first oxide layer 104a may comprise metal oxides of the same kind.

Furthermore, the third oxide layer 104c and the first oxide layer 104a may comprise metal oxides of the same kind.

Moreover, the third oxide layer 104c and the second oxide layer 104b may comprise metal oxides of the same kind.

Each of the materials used for the first electrode 103 and the second electrode 106 is selected from among, for example, Pt (platinum), Ir (iridium), Pd (palladium), Ag (silver), Ni (nickel), W (tungsten), Cu (copper), Al (aluminum), Ta (tantalum), Ti (titanium), TiN (titanium nitride), TaN (tantalum nitride), and TiAlN (titanium aluminum nitride).

To be more specific, the second electrode 106 connected to the third metal oxide having a lower oxygen deficiency level comprises a material, such as platinum (Pt), iridium (Ir), or Pd (palladium) that has a standard electrode potential higher than the standard electrode potentials of the metal included in the third metal oxide and the material included in the first electrode 103. Moreover, the first electrode 103 connected to the first metal oxide having a higher oxygen deficiency level may comprise a material, such as W (tungsten), Ni (nickel), Ta (tantalum), Ti (titanium), Al (aluminum), TaN (tantalum nitride), or TiN (titanium nitride) that has a standard electrode potential lower than the standard electrode potential of the metal included in the first metal oxide. When the standard electrode potential is higher, this material is less oxidizable.

To be more specific, a relationship among a standard electrode potential $V_2$ of the second electrode 106, a standard electrode potential $V_{r2}$ of the metal included in the third metal oxide, a standard electrode potential $V_{r1}$ of the metal included in the first metal oxide, and a standard electrode potential $V_1$ of the first electrode 103 may satisfy $V_{r2} < V_2$ and $V_1 < V_2$. Moreover, when $V_2 > V_{r2}$, a relationship expressed by $V_{r1} \geq V_1$ may be satisfied.

With the above configuration, an oxidation-reduction reaction selectively occurs in the third metal oxide at a position closer to an interfacial surface between the second electrode 106 and the third metal oxide. As a result, a stable resistance change phenomenon can be obtained.

It should be noted that, in Embodiment 1, since the localized region 105 is formed not to be in contact with the first electrode 103, the first electrode 103 does not influence the resistance change. Thus, with the localized region 105 in Embodiment 1, a material to be used for the first electrode 103 can be selected with more flexibility. More specifically, the same material may be used for each of the first electrode 103 and the second electrode 106, for example. In this case, since a process condition for the first electrode 103 can be applied to the second electrode 106, the process can, be simplified.

Moreover, a silicon single-crystal substrate or a semiconductor substrate may be used as the substrate 101, for example. However, these examples are not intended to be limiting. The variable resistance layer 104 can be formed at a relatively low substrate temperature. Thus, the variable resistance layer 104 can be formed on a substrate comprising, for example, a resin material.

Furthermore, the nonvolatile memory element 100 may further include a load element, such as a fixed resistor, a transistor, or a diode, that is electrically connected to the variable resistance layer 104.

Moreover, in Embodiment 1, the resistivity for each of the layers and regions included in the variable resistance layer 104 may be implemented by adjusting the relationship of the oxygen content atomic percentages between these layer and regions.

For example, suppose that the variable resistance layer 104 comprises a metal oxide having a non-stoichiometric composition including a p-type carrier, or more specifically, the variable resistance layer 104 comprises a metal-deficient oxide or an oxygen-rich oxide. In this case, when the oxygen content atomic percentage is higher, the resistance value is lower. Therefore, in this case, the oxygen content atomic percentage is the highest in the first oxide layer 104a, followed by the second oxide layer 104b and then the third oxide layer 104c. Moreover, the localized region 105 is higher in the oxygen content atomic percentage than the third oxide layer 104c, and is different in the oxygen content atomic percentage from the second oxide layer 104b.

Furthermore, suppose that the variable resistance layer 104 comprises a metal oxide having a non-stoichiometric composition including an n-type carrier, or more specifically, the variable resistance layer 104 comprises an oxygen-deficient oxide or a metal-rich oxide. In this case, when the oxygen content atomic percentage is higher, the resistance value is higher. Therefore, in this case, the oxygen content atomic percentage is the lowest in the first oxide layer 104a, followed by the second oxide layer 104b and then third oxide layer 104c in this order. Moreover, the localized region 105 is lower in the oxygen content atomic percentage than the third oxide layer 104c, and is different in the oxygen content atomic percentage from the second oxide layer 104b.

Furthermore, in Embodiment 1, the resistivity relationship between the layers and regions included in the variable resistance layer 104 can be obtained by calculating the resistivity from the relationship between the composition and the resistivity after composition analysis is performed by measuring oxygen by an energy dispersive X-ray spectrometer (EDS) and then measuring metal by electron energy loss spectroscopy (EELS).

[Manufacturing Method and Operation of Nonvolatile Memory Element]

Next, an example of a method of manufacturing the nonvolatile memory element 100 in Embodiment 1 is described, with reference to FIG. 4A to FIG. 4D.

Figure 4A:
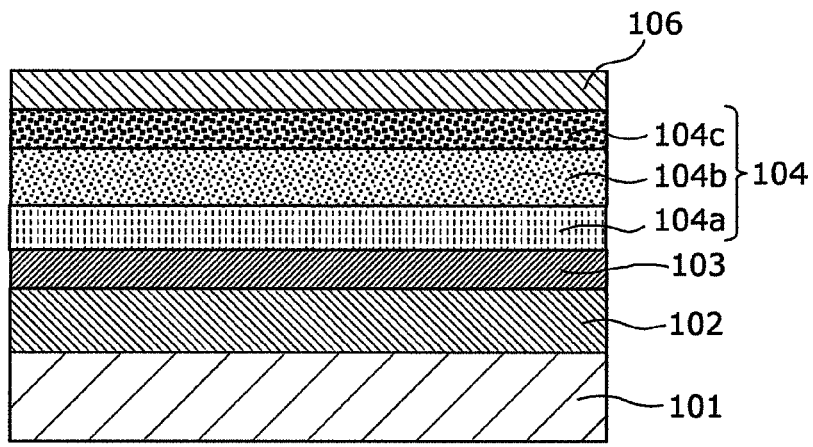
FIG. 4A is a cross-sectional diagram showing a method of manufacturing a main part of the nonvolatile memory element in Embodiment 1 according to the present invention.

Firstly, as shown in FIG. 4A, the interlayer dielectric 102 which is 200 nm in thickness is formed on the substrate 101 that is, for example, a single-crystal silicon, according to a thermal oxidation method. Then, a TaN film which is 100 nm in thickness for example is formed as the first electrode 103 on the interlayer dielectric 102, according to a sputtering method. It should be noted that a Ti adhesion layer or a TiN adhesion layer may also be formed between the first electrode 103 and the interlayer dielectric 102, according to the sputtering method. After this, the first oxide layer 104a is formed on the first electrode 103a according to a reactive sputtering method using, for example, a Ta target.

Next, the second oxide layer 104b having a lower resistivity than the first oxide layer 104a is formed on the upper surface of the first oxide layer 104a, according to the reactive sputtering method using, for example, a Ta garget.

Then, the third oxide layer 104c having a higher resistivity than the second oxide layer 104b is formed on the upper surface of the second oxide layer 104b, according to, for example, modification by oxidation on the uppermost surface of the second oxide layer 104b or the reactive sputtering method using a Ta garget. The variable resistance layer 104 has the stacked structure in which the first oxide layer 104a, the second oxide layer 104b, and the third oxide layer 104c are stacked.

Here, when the third oxide layer 104c is too thick, an initial resistance value is too high, for example. On the other hand, when the third oxide layer 104c is too thin, a stable resistance change cannot be obtained. On this account, the thickness may be from 1 nm to 8 nm inclusive.

Next, an Ir film which is 150 nm in thickness for example is formed as the second electrode 106 on the third oxide layer 104c, according to the sputtering method.

Figure 4B:
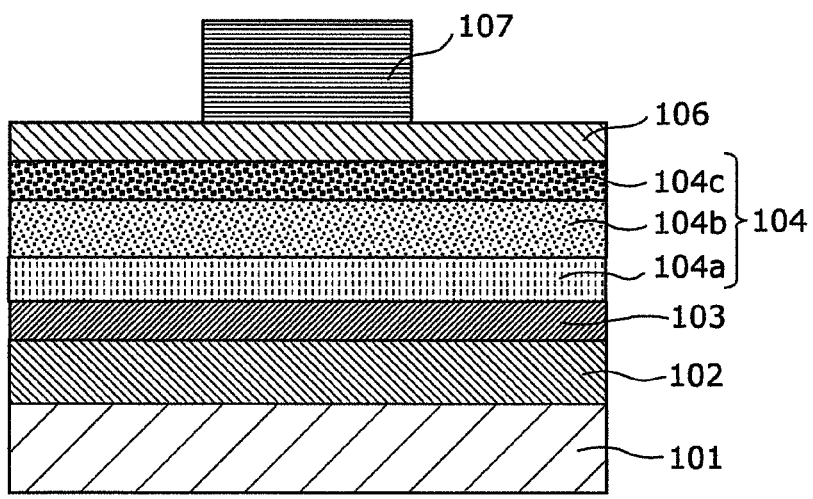
FIG. 4B is a cross-sectional diagram showing a method of manufacturing a main part of the nonvolatile memory element in Embodiment 1 according to the present invention.
Figure 4C:
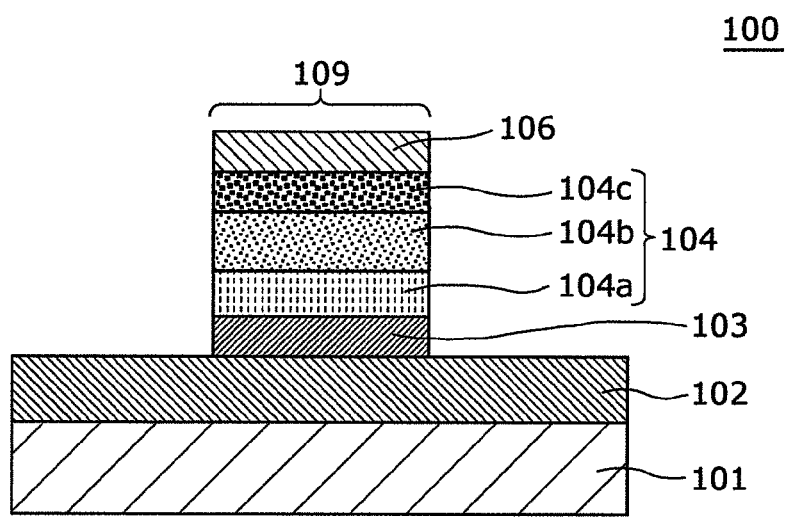
FIG. 4C is a cross-sectional diagram showing a method of manufacturing a main part of the nonvolatile memory element in Embodiment 1 according to the present invention.

Then, as shown in FIG. 4B, a pattern 107 of a photoresist is formed according to a photolithography process. After this, as shown in FIG. 4C, an element region 109 is formed according to a dry etching method using the pattern 107 as a mask.

Figure 4D:
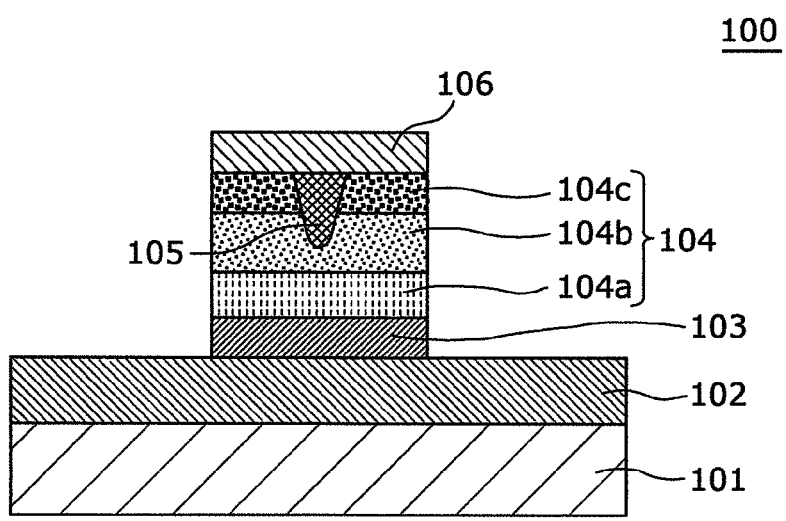
FIG. 4D is a cross-sectional diagram showing a method of manufacturing a main part of the nonvolatile memory element in Embodiment 1 according to the present invention.

Following this, as shown in FIG. 4D, the localized region 105 is formed in the variable resistance layer 104 by the application of the initial breakdown voltage between the first electrode 103 and the second electrode 106 (between the electrodes).

Figure 5:
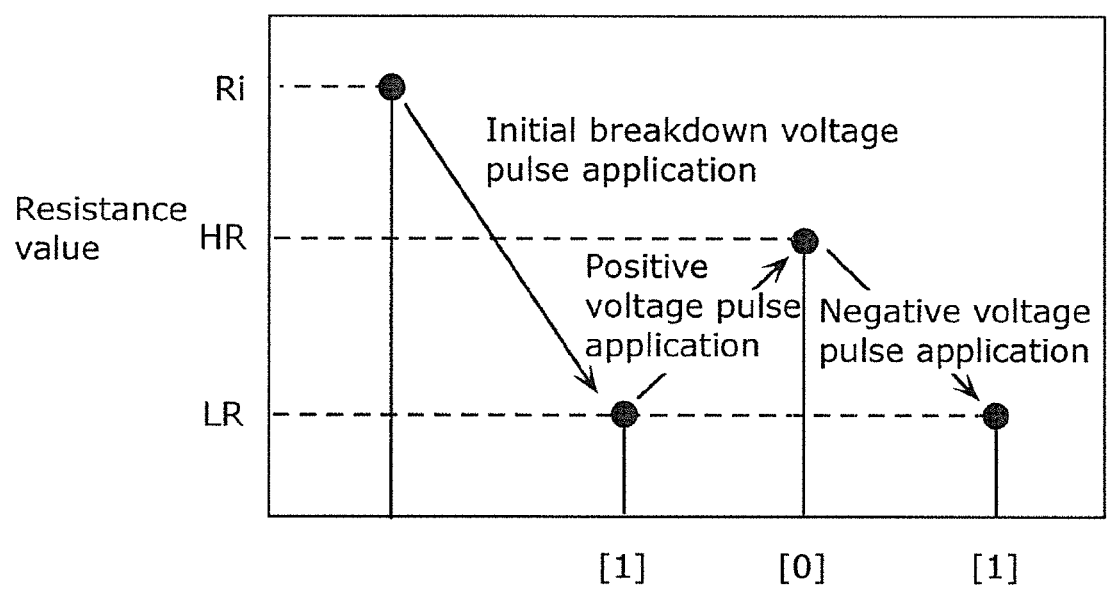
FIG. 5 is a diagram showing an example of an operation performed by the nonvolatile memory element in Embodiment 1 according to the present invention.

FIG. 5 is a diagram showing an example of an operation performed by the nonvolatile memory element 100 in Embodiment 1. A nonvolatile memory element used as a sample in the measurement in FIG. 5 includes the first electrode 103, the second electrode 106, and the variable resistance layer 104 which are 0.5 μm*0.5 μm in size (0.25 μm² in area). Moreover: the resistivity of the first oxide layer 104a is 1 Ωm·cm; the resistivity of the second oxide layer 104b is 15 Ωm·cm; and the third oxide layer 104c is an insulator and 4.2 nm in thickness. When a read voltage (0.4 V, for example) is applied between the electrodes in the nonvolatile memory element 100 described thus far, the initial resistance value is approximately $10^7$ Ω to $10^8$ Ω.

As shown in FIG. 5, when the resistance value of the nonvolatile memory element 100 is the initial resistance value (a value higher than a resistance value HR in the high resistance state, such as $10^7$ Ω to $10^8$ Ω), the resistance state changes by the application of the initial breakdown voltage between the electrodes.

After this, two kinds of voltage pulses which are, for example, 100 ns in pulse width and different in polarity are alternately applied as the write voltages between the first electrode 103 and the second electrode 106 of the nonvolatile memory element 100. As a result, the resistance value of the variable resistance layer 104 changes as shown in FIG. 5. To be more specific, when a negative voltage pulse (100 ns in pulse width) is applied as the write voltage between the electrodes, the resistance value of the variable resistance layer 104 decreases from the high resistance value HR to a low resistance value LR. On the other hand, when a positive voltage pulse (100 ns in pulse width) is applied as the write voltage between the electrodes, the resistance value of the variable resistance layer 104 increases from the low resistance value LR to the high resistance value HR. It should be noted that, in the present specification, the polarity of the voltage pulse is: "positive" when the potential of the second electrode 106 is high with respect to the potential of the first electrode 103; and "negative" when the potential of the second electrode 106 is low with respect to the potential of the first electrode 103.

As described thus far, the nonvolatile memory element in Embodiment 1 allows the localized region 105 to be smaller than the thickness of the variable resistance layer 104 and thereby allows electric field concentration to occur. Thus, the resistance can be changed by the application of a low voltage. Moreover, since the localized region 105 is not in contact with the first electrode 103, a resistance change in parasitic resistance resulting from the influence of the first electrode 103 when the localized region 105 is in contact with the first electrode 103 can be reduced. Accordingly, the fluctuations in the variable resistance characteristics can be reduced. In addition, the variable resistance layer 104 includes the first oxide layer 104a, the second oxide layer 104b, and the third oxide layer 104c which increase in resistivity in this order. The length (depth) of the localized region 105 can be controlled by the second oxide layer 104b. Therefore, the change in resistance resulting from the fluctuations in the length of the localized region 105 can be reduced and, accordingly, the fluctuations in the variable resistance characteristics can be further reduced.

[Application 1 of Embodiment 1]

A nonvolatile memory device in Application 1 includes the nonvolatile memory element described in Embodiment 1, and is a so-called 1T1R device configured with a one-transistor/one-nonvolatile-memory unit.

[Configuration of Nonvolatile Memory Device]

Figure 6:
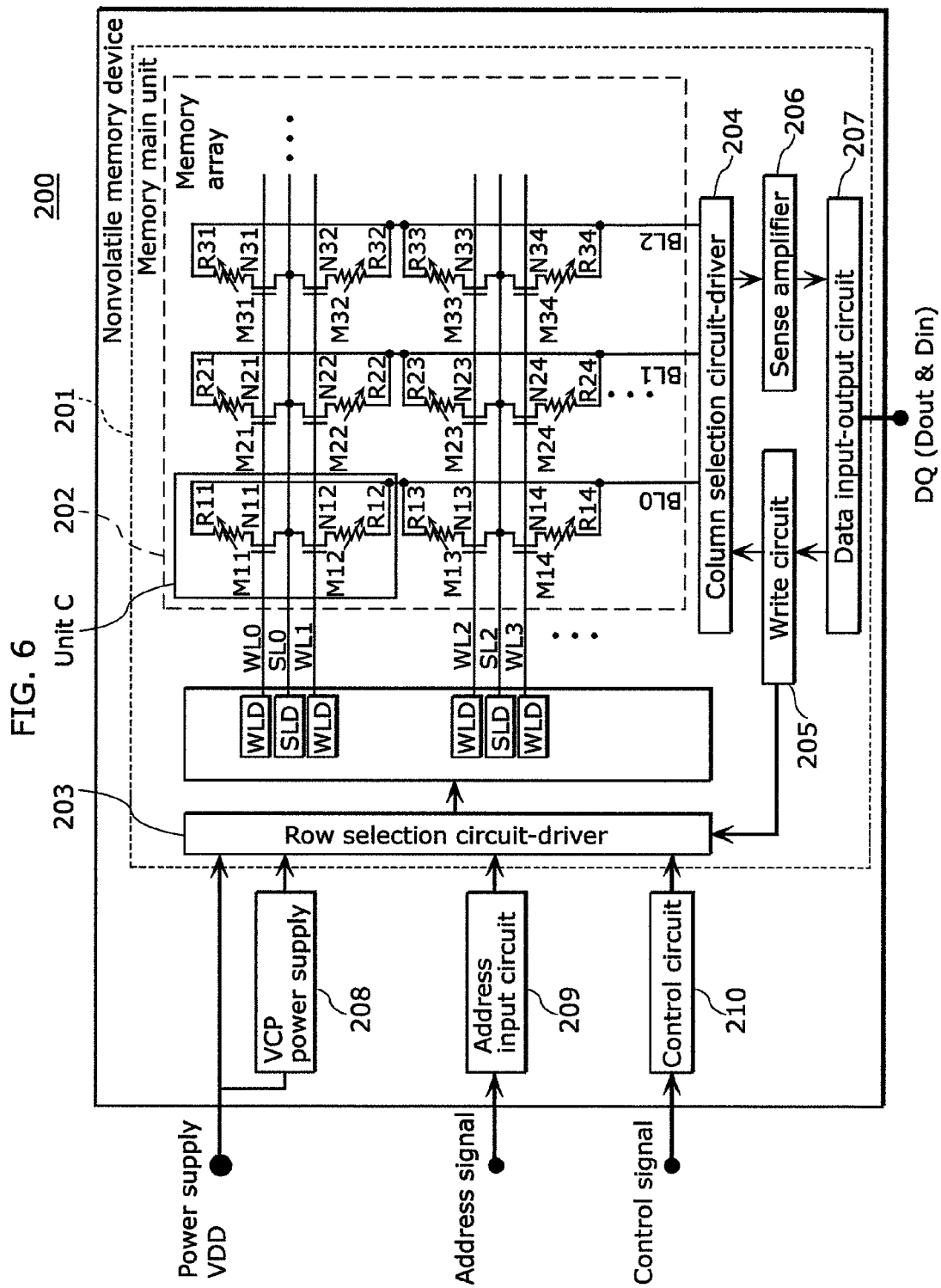
FIG. 6 is a block diagram showing a configuration of a nonvolatile memory device in Application of Embodiment 1 according to the present invention.
Figure 7:
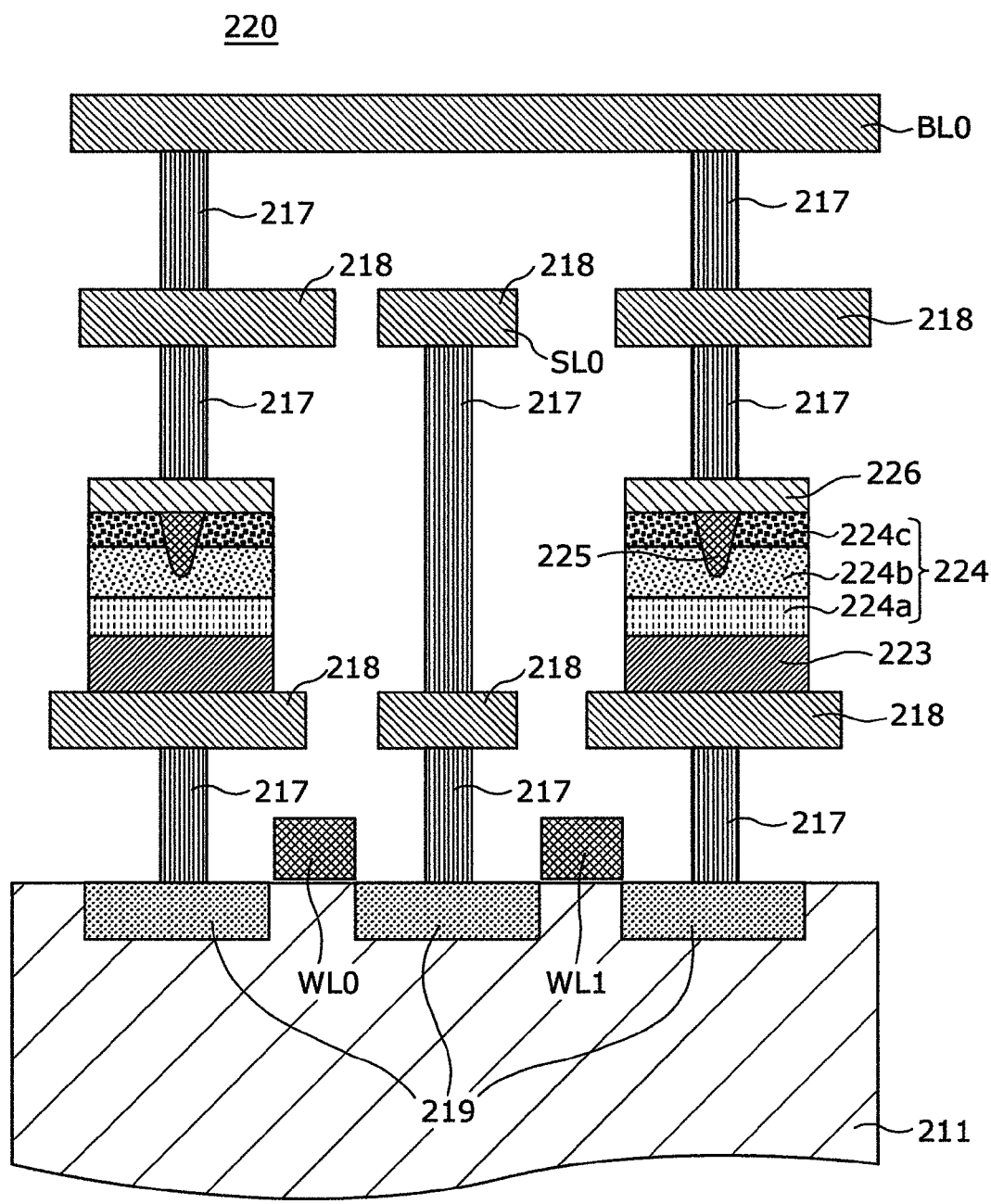
FIG. 7 is a cross-sectional diagram showing a structure corresponding to two bits shown in in FIG. 6.

FIG. 6 is a block diagram showing a configuration of a nonvolatile memory device 200 in Application 1 of Embodiment 1 according to the present invention. FIG. 7 is a cross-sectional diagram showing a structure of a unit C (a structure corresponding to two bits) shown in FIG. 6.

As shown in FIG. 6, the nonvolatile memory device 200 in Application 1 includes a semiconductor substrate and a memory main unit 201 formed on the semiconductor substrate. The memory main unit 201 includes a memory array 202, a row selection circuit-driver 203, a column selection circuit-driver 204, a write circuit 205 for writing information, a sense amplifier 206 for detecting the amount of current passing through a selected bit line and determining whether data is "1" or "0", and a data input-output circuit 207 for performing an input/output process on input/output data via a terminal DQ.

Moreover, the nonvolatile memory device 200 further includes a cell plate power supply (VCP power supply) 208, an address input circuit 209 for receiving an address signal from an external source, and a control circuit 210 for controlling an operation of the memory main unit 201 according to a control signal received from an external source.

The memory array 202 includes a plurality of word lines WL0, WL1, WL2, WL3, . . . , and a plurality of bit lines BL0, BL1, BL2, . . . . Here, the word lines and the bit lines are formed on the semiconductor substrate and arranged to cross each other. In addition, the memory array 202 includes a plurality of transistors N11, N12, N13, N14, N21, N22, N23, N24, N31, N32, N33, N34, . . . (referred to as the "transistors N11, N12, . . ." hereafter) which are provided corresponding to three-dimensional cross-points of the word lines WL0, WL1, WL2, WL3, . . . , and the bit lines BL0, BL1, BL2, . . . and which are connected to the corresponding word lines WL0, WL1, WL2, WL3, . . . , and the corresponding bit lines BL0, BL1, BL2. Furthermore, the memory array 202 includes a plurality of memory cells M11, M12, M13, M14, M21, M22, M23, M24, M31, M32, M33, M34, . . . (referred to as the "memory cells M11, M12, . . ." hereafter) which are provided corresponding to the transistors N11, N12, . . . on a one-to-one basis.

Moreover, the memory array 202 includes a plurality of plate lines SL0, SL2, . . . arranged in parallel to the word lines WL0, WL1, WL2, WL3, . . . .

As shown in FIG. 7, the bit line BL0 is positioned above the word lines WL0 and WL1, and the plate line SL0 is positioned between the word lines WL0 and WL1 and the bit line BL0.

Here, each of the memory cells M11, M12, . . . corresponds to the nonvolatile memory element 100 described in Embodiment 1. To be more specific, a nonvolatile memory element 220 shown in FIG. 7 corresponds to each of the memory cells M11, M12, . . . shown in FIG. 6. The nonvolatile memory element 220 includes an upper electrode 226, a variable resistance layer 224, a localized region 225, and a lower electrode 223 which are formed a substrate 211.

The variable resistance layer 224 includes a first oxide layer 224a, a second oxide layer 224b formed on the first oxide layer 224a, and a third oxide layer 224c formed on the second oxide layer 224b.

The localized region 225 is positioned in the second oxide layer 224b and the third oxide layer 224c to be in contact with the upper electrode 226 and not to be in contact with the first oxide layer 224a.

The localized region 225 has a resistivity that is lower than a resistivity of the third oxide layer 224c and different from a resistivity of the second oxide layer 224b.

The upper electrode 226, the variable resistance layer 224, the localized region 225, and the lower electrode 223 correspond, respectively, to the second electrode 106, the variable resistance layer 104, the localized region 105, and the first electrode 103 included in the nonvolatile memory element 100 shown in FIG. 1 in Embodiment 1.

It should be noted that, in FIG. 7, a reference sign "217" indicates a plug layer, a reference sign "218" indicates a metal wiring layer, and a reference sign "219" indicates a source/drain region.

As shown in FIG. 6: the drains of the transistors N11, N12, N13, N14, . . . are connected to the bit line BL0; the drains of the transistors N21, N22, N23, N24, . . . are connected to the bit line BL1; and the drains of the transistors N31, N32, N33, N34, . . . are connected to the bit line BL2.

Moreover: the gates of the transistors N11, N21, N31, . . . are connected to the word line WL0; the gates of the transistors N12, N22, N32, . . . are connected to the word line WL1; the gates of the transistors N13, N23, N33, . . . are connected to the word line WL2; and the gates of the transistors N14, N24, N34, . . . are connected to the word line WL3.

Furthermore, the sources of the transistors N11, N12, . . . are connected to the corresponding memory cells M11, M12, . . . .

Moreover: the memory cells M11, M21, M31, . . . and the memory cells M12, M22, M32, . . . are connected to the plate line SL0; and the memory cells M13, M23, M33, . . . , the memory cells M12, M22, M32, . . . and the memory cells M14, M24, M34, . . . are connected to the plate line SL2.

The address input circuit 209 receives an address signal from an external circuit (not illustrated). According to this address signal, the address input circuit 209 outputs a row address signal to the row selection circuit-driver 203 and also outputs a column address signal to the column selection circuit-driver 204. Here, the address signal indicates an address of a specific memory cell selected from among the memory cells M11, M12, . . . . Moreover, the row address signal indicates a row address included in the address indicated by the address signal, and the column address signal indicates a column address included in the address indicated by the address signal.

In an information write cycle, the control circuit 210 outputs, to the write circuit 205, a write signal instructing an application of a write voltage according to input data "Din" received by the data input-output circuit 207. On the other hand, in an information read cycle, the control unit 210 outputs, to the column selection circuit-driver 204, a read signal instructing an application of a read voltage.

Receiving the row address signal outputted from the address input circuit 209, the row selection circuit-driver 203 selects one of the word lines WL0, WL1, WL2, WL3, . . . according to the received row address signal. Then, the row selection circuit-driver 203 applies a predetermined voltage to the selected word line. The row selection circuit-driver 203 selects at least one of the memory cells M11, M12, . . . included in the memory array 202.

Receiving the column address signal outputted from the address input circuit 209, the column selection circuit-driver 204 selects one of the bit lines BL0, BL1, BL2, . . . according to the received column address signal. Then, the column selection circuit-driver 204 applies the write voltage or the read voltage the to the selected bit line. The column selection circuit-driver 204 writes data by applying the voltage to the memory cell selected by the row selection circuit-driver 203. The column selection circuit-driver 204 reads data by detecting the resistance value of the memory cell selected by the row selection circuit-driver 203.

When receiving the write signal outputted from the control circuit 210, the write circuit 205 outputs, to the column selection circuit-driver 204, a signal instructing an application of the write voltage to the selected bit line.

Moreover, in the information read cycle, the sense amplifier 206 detects the amount of current passing through the selected bit line to be read, and then determines whether the data is "1" or "0". Output data "DO" obtained as a result of this is outputted to an external circuit via the data input-output circuit 207.

Application 1 having the configuration of the one-transistor/one-nonvolatile-memory unit (1T1R) can be easily combined with the complementary metal-oxide-semiconductor (CMOS) process, and also has an advantage that the operation can be easily controlled.

Each of FIG. 6 and FIG. 7 shows a configuration example where the upper electrode 226 is connected to the bit line, and the source or drain of the transistor is connected to the plate line. However, a different configuration may be employed. In this case, when a current is to be passed through the memory cell in a direction for reducing the resistance of the memory cell, a transistor type (P type or N type) that allows the transistor to have a source follower connection is selected and the transistor may be connected to the memory cell.

Moreover, in FIG. 6, each of the source lines is supplied with a certain voltage as the plate line. However, a driver capable of supplying a different voltage or current for each of the source lines may be provided.

Furthermore, in FIG. 6, the plate lines (the source lines) are arranged in parallel to the word lines. However, the plate lines may be arrange in parallel to the bit lines.

[Example of Operation of Nonvolatile Memory Device]

Figure 8:
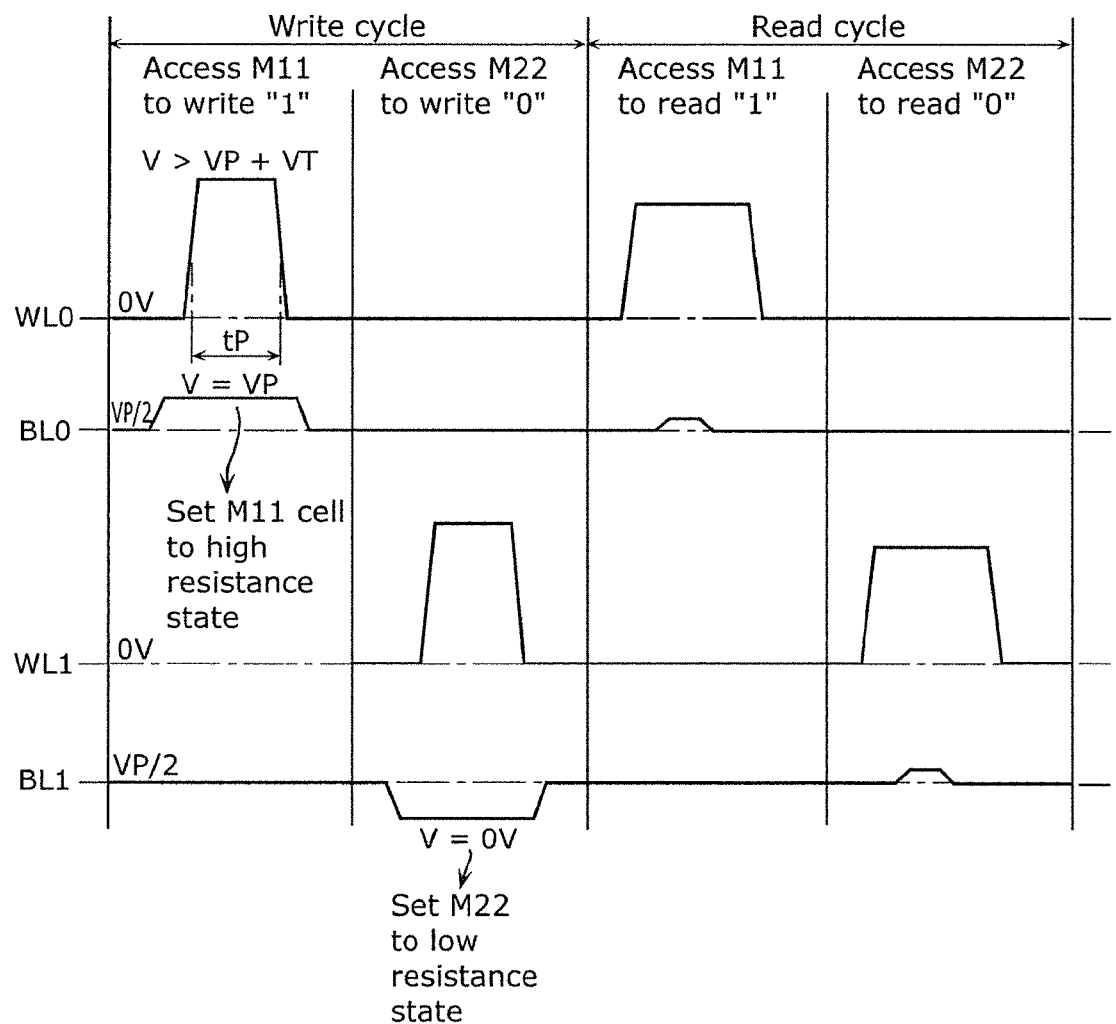
FIG. 8 is a timing diagram showing an example of an operation performed by the nonvolatile memory device in Application 1 of Embodiment 1 according to the present invention.

Next, the following describes an example of an operation performed by the nonvolatile memory device 200 in Application 1 in the write cycle to write information and in the read cycle to read information, with reference to a timing diagram shown in FIG. 8.

FIG. 8 is a timing diagram showing an example of an operation performed by the nonvolatile memory device 200 in Application 1. It should be noted that, in the present example of the operation, information "1" is assigned to the case where the variable resistance layer 224 is in the high resistance state and information "0" is assigned to the case where the variable resistance layer 224 is in the low resistance state. Moreover, for convenience of explanation, the following describes only the case where the information is written into and read from the memory cells M11 and M22.

In FIG. 8: "VP/2" represents a pre-charge voltage at which no resistance change occurs; "VP" represents an amplitude of a pulse voltage needed for the variable resistance element to change in resistance; and "VT" represents a threshold voltage of the transistor. Moreover, the voltage VP/2 is applied to the plate line all the time, and the bit line is also pre-charged by the voltage VP/2 when not selected.

In the write cycle for the memory cell M11, a pulse voltage V (>VP+VT) having a pulse width "tP" is applied to the word line WL0, and the transistor N11 enters an ON state. In accordance with this timing, the pulse voltage VP is applied to the bit line BL0. With this, the write voltage for writing the information "1" is applied to the memory cell M11 and, as a result, the variable resistance layer 224 of the memory cell M11 is set in the high resistance state. More specifically, the information "1" is written into the memory cell M11.

Next, in the write cycle for the memory cell M22, a pulse voltage V (>VP+VT) having the pulse width tP is applied to the word line WL1, and the transistor N22 enters the ON state. In accordance with this timing, a voltage 0V is applied to the bit line BL1. With this, the write voltage for writing the information "0" is applied to the memory cell M22 and, as a result, the variable resistance layer 224 of the memory cell M22 is set in the low resistance state. More specifically, the information "0" is written into the memory cell M22.

In the read cycle for the memory cell M11, a predetermined voltage is applied to the word line WL0 to set the transistor N11 to the ON state. In accordance with this timing, a pulse voltage having a pulse width which is smaller in amplitude than the pulse width in the write cycle is applied to the bit line BL0. With this, a current corresponding to the resistance value of the variable resistance layer 224 of the memory cell M11 that is in the high resistance state is outputted. As a result, by detecting this output current value, the information "1" is read.

Next, in the read cycle for the memory cell M22, the voltage which is the same as the voltage applied in the aforementioned read cycle for the memory cell M11 is applied to the word line WL1 and the bit line BL1. With this, a current corresponding to the resistance value of the variable resistance layer 224 of the memory cell M22 that is in the low resistance state is outputted. As a result, by detecting this output current value, the information "0" is read.

The nonvolatile memory device 200 in Application 1 also includes the nonvolatile memory element that is capable of an excellent resistance change operation. Hence, a stable operation can be implemented.

Figure 9A:
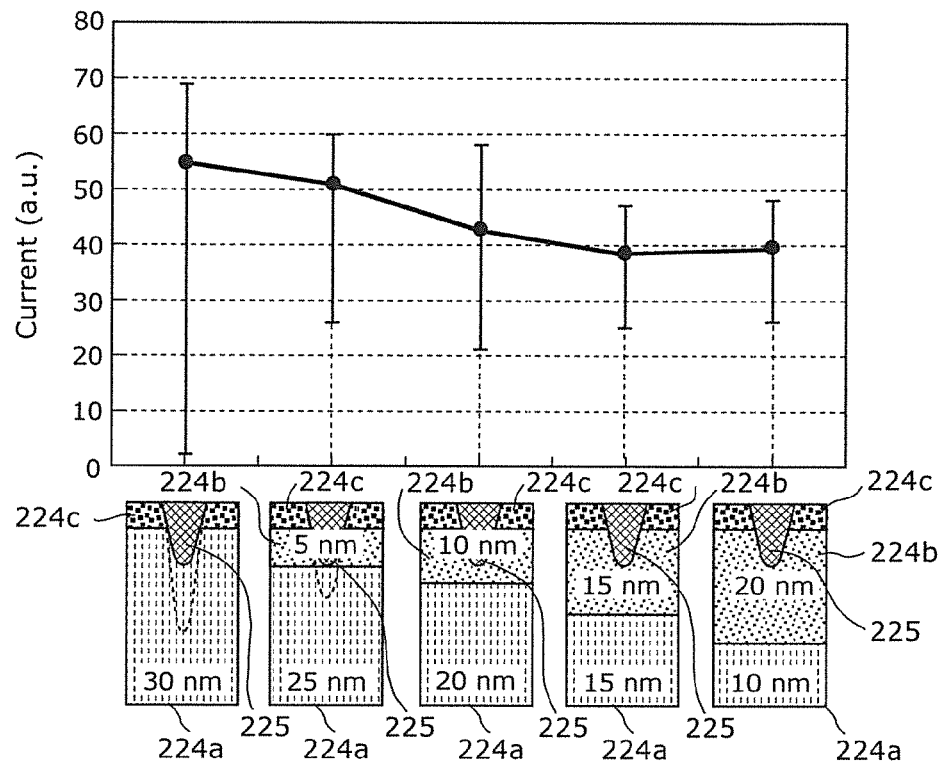
FIG. 9A is a diagram showing a film thickness dependence of a variable resistance current on a second oxide layer in the case where the nonvolatile memory device includes a tantalum oxide as a variable resistance layer, in Application 1 of Embodiment 1 according to the present invention.

FIG. 9A is a diagram showing a relationship between the cell current of the 1k-bit nonvolatile memory device and the configuration of the variable resistance layer 224. In FIG. 9A, the horizontal axis represents the structure of the variable resistance layer 224, and the vertical axis represents the cell current in the low resistance state LR. According to the measurement in FIG. 9A: the resistivity of the first oxide layer 224a is 1 Ωm·cm; the resistivity of the second oxide layer 224b is 15 Ωm·cm; and the third oxide layer 224c is an insulator and 4.2 nm in thickness. In each of FIG. 9A and FIG. 9B, a broken line extending downward from the localized region 225 indicates the fluctuations in the depth (shape) of the localized region 225.

From FIG. 9A, it can be understood that the cell current significantly fluctuates in the low resistance state LR in the case where the nonvolatile memory device 200 includes the nonvolatile memory element having the variable resistance layer 224 with a two-layer structure comprising the first oxide layer 224a and the third oxide layer 224c. On the other hand, it can also be understood that, with the same driving voltage, the cell current insignificantly fluctuates in the low resistance state LR in the case where the nonvolatile memory device includes the nonvolatile memory element having the variable resistance layer 224 with a three-layer structure comprising the first oxide layer 224a, the second oxide layer 224b, and the third oxide layer 224c.

Figure 9B:
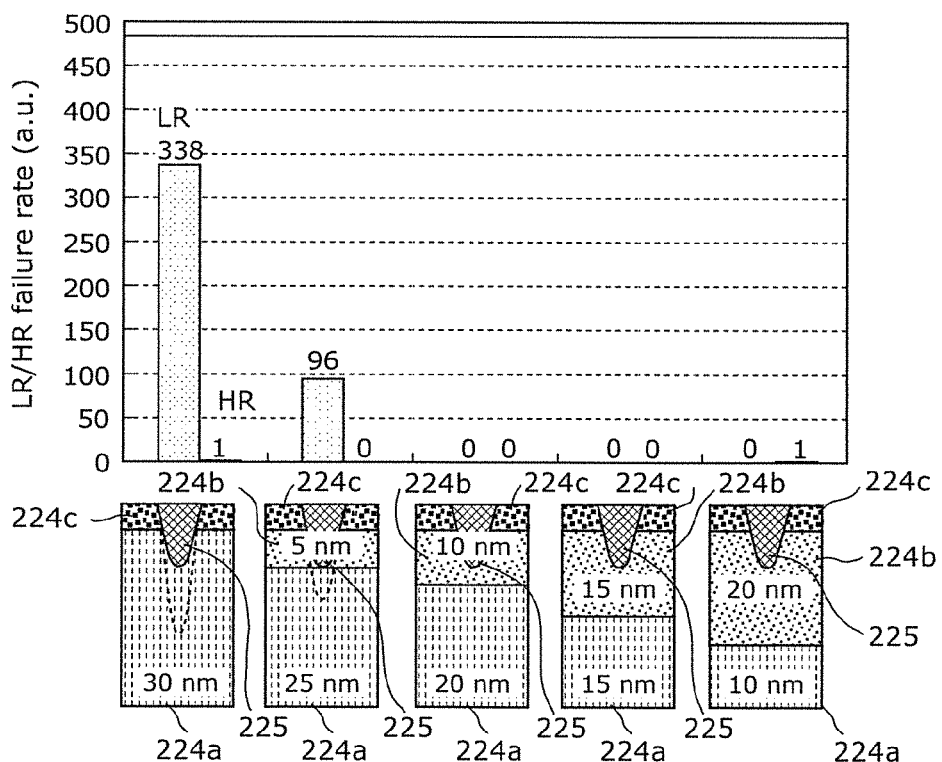
FIG. 9B is a diagram showing a film thickness dependence of failure rates of a high resistance state and a low resistance state on the second oxide layer in the case where the nonvolatile memory device includes the tantalum oxide as the variable resistance layer, in Application 1 of Embodiment 1 according to the present invention.

FIG. 9B is a diagram showing a relationship between the 100k-cycle endurance characteristics and the structure of the variable resistance layer 224 of the 1k-bit nonvolatile memory device. In FIG. 9B, the horizontal axis represents the structure type of the variable resistance layer 224. The vertical axis represents, for each of the structure types, the rate of HR failure in which the high resistance state is not achieved (the number indicated on the right side in FIG. 9B) or the rate of LR failure in which the low resistance state is not achieved (the number indicated on the left side in FIG. 9B), each of the rates being indicated in an arbitrary unit of measurement.

From FIG. 9B, it can be understood that the failure rate is high when the nonvolatile memory device includes the two-layer nonvolatile memory element. On the other hand, it can also be understood that, with the same driving voltage, the failure rate is low when the nonvolatile memory device includes the nonvolatile memory element having the three-layer variable resistance layer 224.

Moreover, it can be understood that the failure rate is approximately 0 when the nonvolatile memory device includes the nonvolatile memory element having the second oxide layer 224b that is greater in thickness than 5 nm, or more specifically, 10 nm, 15 nm, and 20 nm. In other words, it can be understood that the failure rate is approximately 0 when the nonvolatile memory device includes the nonvolatile memory element in which the localized region 225 is not formed in the first oxide layer 224a and the lower end of the localized region 225 does not reach (is not in contact with) the first oxide layer 224a.

It is believed that the failure rate is improved because the fluctuations in the length of the localized region 225 could be reduced by forming the variable resistance layer 224 in the three-layer structure. This mechanism is assumed as follows.

After the localized region 225 is formed in the variable resistance layer 224 by the initial breakdown, the voltage applied to the third oxide layer 224c becomes low. Here, the resistance of a region between the localized region 225 and the lower electrode 223 serves as a load resistance. When the variable resistance layer 224 has the two-layer structure, the first oxide layer 224a serves as the load resistance. When the variable resistance layer 224 has the three-layer structure, the first oxide layer 224a and the second oxide layer 224b serve as the load resistances. When a predetermined voltage is applied to the variable resistance layer 224, the applied voltage is divided for the localized region 225 and the load resistance. When the variable resistance layer 224 has the two-layer structure, the resistivity of the first oxide layer 224a serving as the load resistance is low. On this account, the partial voltage for the localized region 225 is large, and the localized region 225 thus further grows in the first oxide layer 224a. Here, due to the fluctuations in the resistance value of the first oxide layer 224a for each element, the length to which the localized region 225 grows fluctuates. On the other hand, when the variable resistance layer 224 has the three-layer structure, the resistance value of the second oxide layer 224b in particular is high, out of the first oxide layer 224a and the second oxide layer 224b serving as the load resistances. On this account, the partial voltage for the localized region 225 is reduced, and the localized region 225 stops growing in the second oxide layer 224b. Accordingly, it is believed that even when the resistance value of the second oxide layer 224b fluctuates for example, the fluctuations in the length of the localized region 225 can be reduced.

Figure 10A:
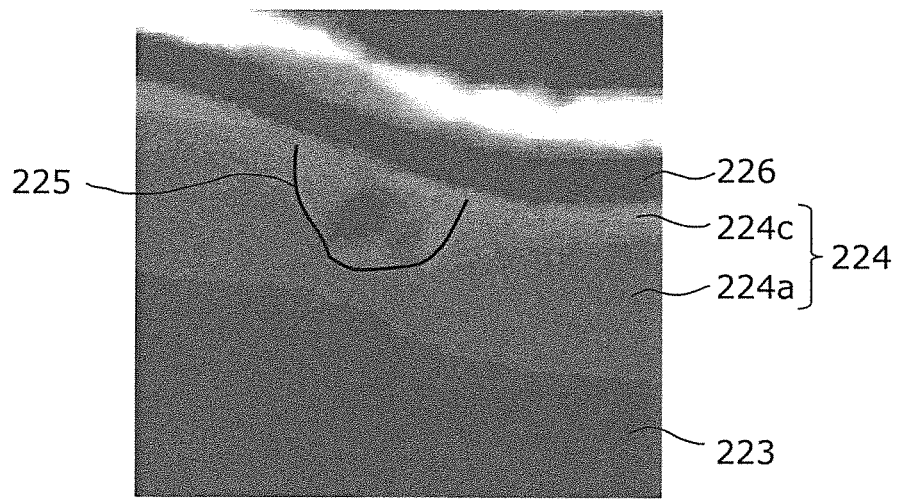
FIG. 10A is a diagram showing a transmission electron microscopy (TEM) picture showing the size of a localized region when a load resistance is 100Ω in the case where the nonvolatile memory element includes the tantalum oxide as the variable resistance layer, in Application 1 of Embodiment 1 according to the present invention.
Figure 10B:
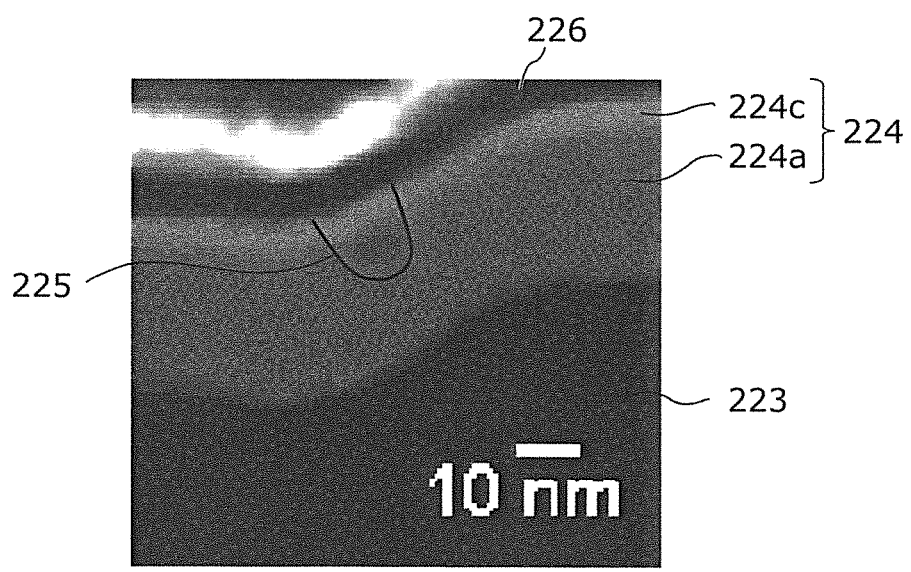
FIG. 10B is a diagram showing a TEM picture showing the size of the localized region when the load resistance is 5000Ω in the case where the nonvolatile memory element includes the tantalum oxide as the variable resistance layer, in Application 1 of Embodiment 1 according to the present invention.

FIG. 10A is a diagram showing a cross-sectional TEM picture of the localized region 225 in the case where the load resistance of 100Ω is used in the two-layer nonvolatile memory element. FIG. 10B is a diagram showing a cross-sectional TEM picture of the localized region 225 in the case where the load resistance of 5000Ω is used in the two-layer nonvolatile memory element.

From FIG. 10A and FIG. 10B, it can be understood that the length of the localized region 225 is reduced to, for example, approximately 10 nm as shown in FIG. 10B when the load resistance is increased.

Similarly, suppose the case where the first oxide layer 224a and the third oxide layer 224c serve as different load resistances. In this case, when the nonvolatile memory element has the two-layer structure and the localized region 225 is formed in the third oxide layer 224c, the resistance value of the third oxide layer 224c is reduced during the process of forming the localized region 105. However, since the resistivity of the first oxide layer 224a is low, the electric field is concentrated again on the second oxide layer 104b. Then, the localized region 225 grows and eventually remains in the first oxide layer 224a. Since the growth time of the localized region 225 is long, the length of the localized region 225 significantly fluctuates due to a breakdown and the current value increases as well. On the other hand, in the case of the three-layer nonvolatile memory element according to the present invention, the third oxide layer 224c is higher in resistivity than the first oxide layer 224a and the second oxide layer 224b. Therefore, an electric field applied to the variable resistance layer 224 is likely to concentrate on the third oxide layer 224c. Moreover, the second oxide layer 224b is higher in resistivity than the first oxide layer 224a. On this account, in the case where the localized region 225 is formed in the third oxide layer 224c, the resistance value of the third oxide layer 224c is reduced and the electric field is concentrated on the second oxide layer 224b during the process of forming the localized region 225. Then, by a reduction in the voltage applied to the third oxide layer 224c, the localized region 225 stops growing and eventually remains in the second oxide layer 224b. Since the growth time of the localized region 225 is reduced, the fluctuations in the length of the localized region 225 are reduced.

However, when the thickness of the second oxide layer 224b is reduced (to 5 nm, for example), the localized region 225 passes through the second oxide layer 224b and enters the first oxide layer 224a. As a result, the aforementioned advantageous effect is not achieved and the failure rate is relatively high, as shown in FIG. 9B.

Figure 11:
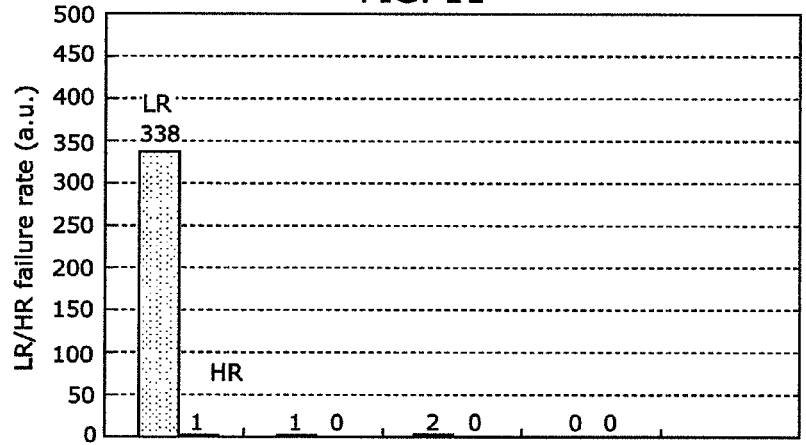
FIG. 11 is a diagram showing a resistivity dependence of the failure rates of the high resistance state and the low resistance state on the second oxide layer in the case where the nonvolatile memory device includes the tantalum oxide as the variable resistance layer, in Application 1 of Embodiment 1 according to the present invention.
Figure 11:
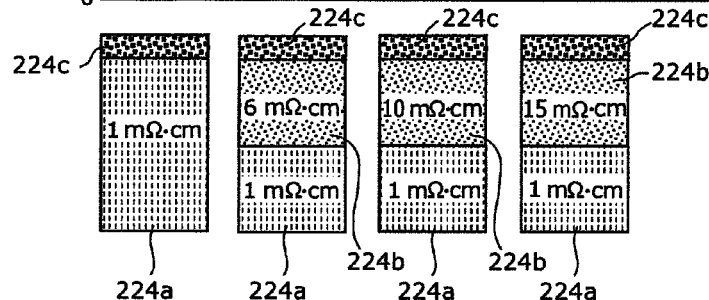

FIG. 11 shows a relationship between the endurance characteristics by 100k cycles of resistance change operations and the resistivity of the second oxide layer 224b of the 1k-bit nonvolatile memory device. In FIG. 11, the horizontal axis represents the structure of the variable resistance layer 224, and the vertical axis represents the rate (in an arbitrary unit of measurement) of HR failure in which the high resistance state is not achieved or of LR failure in which the low resistance state is not achieved.

From FIG. 11, it can be understood that the failure rate is approximately 0 when the nonvolatile memory device includes the nonvolatile memory element having the second oxide layer 224b with the resistivity of 6 Ω·cm. In particular, it can be understood that the rates of HR and LR failures are both 0 when the nonvolatile memory device includes the nonvolatile memory element having the resistivity of 15 mΩ·cm.

[Application 2 of Embodiment 1]

A nonvolatile memory device in Application 2 of Embodiment 1 includes the nonvolatile memory element described in Embodiment 1, and is a so-called cross-point device including the nonvolatile memory element described in Embodiment 1 at a cross-point (a three-dimensional cross-point) of a word line and a bit line.

[Configuration of Nonvolatile Memory Device]

Figure 12:
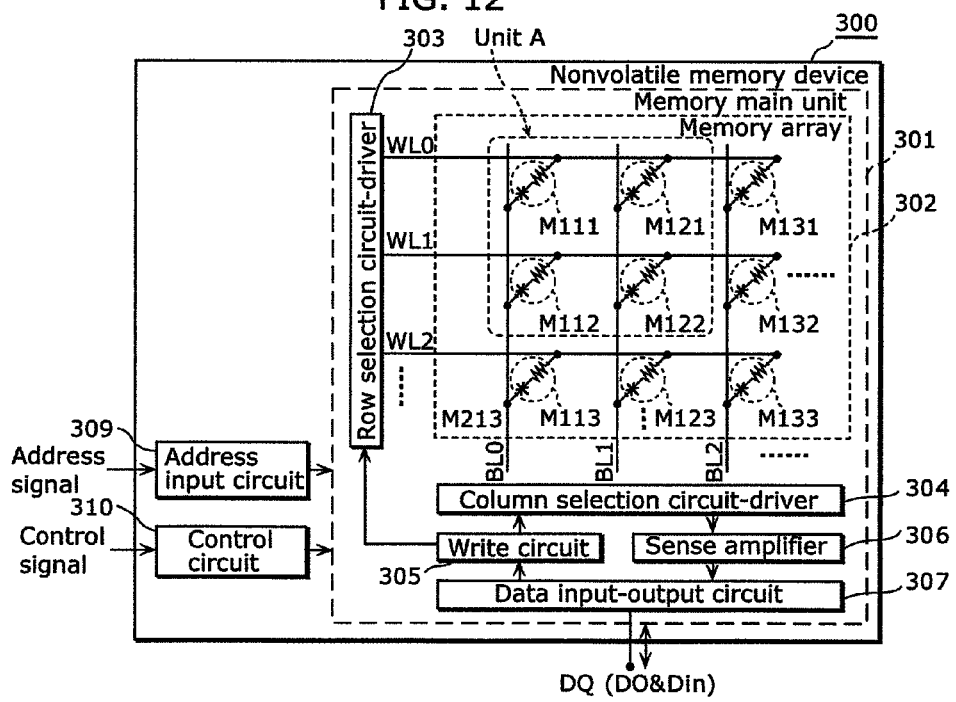
FIG. 12 is a block diagram showing a configuration of a nonvolatile memory device in Application 2 of Embodiment 1 according to the present invention.
Figure 13:
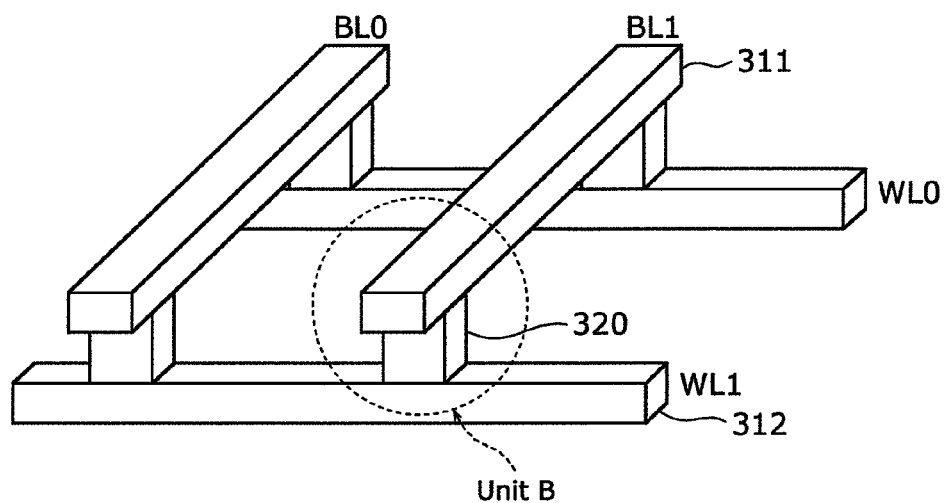
FIG. 13 is a perspective view showing a structure of a unit A (a structure corresponding to four bits) in FIG. 12.

FIG. 12 is a block diagram showing a configuration of a nonvolatile memory device 300 in Application 2 of Embodiment 1 according to the present invention. FIG. 13 is a perspective view showing a structure of a unit A (a structure corresponding to four bits) in FIG. 12.

As shown in FIG. 12, the nonvolatile memory device 300 in Application 2 includes a semiconductor substrate and a memory main unit 301 formed on the semiconductor substrate. The memory main unit 301 includes a memory array 302, a row selection circuit-driver 303, a column selection circuit-driver 304, a write circuit 305 for writing information, a sense amplifier 306 for detecting the amount of current passing through a selected bit line and determining whether data is "1" or "0", and a data input-output circuit 307 for performing an input/output process on input/output data via a terminal DQ.

Moreover, the nonvolatile memory device 300 further includes an address input circuit 309 for receiving an address signal from an external source, and a control circuit 310 for controlling an operation of the memory main unit 301 according to a control signal received from an external source.

As shown in FIG. 12 and FIG. 13, the memory array 302 includes a plurality of word lines WL0, WL1, WL2, . . . and a plurality of bit lines BL0, BL1, BL2, . . . . The word lines WL0, WL1, WL2, . . . are arranged in parallel to each other on the semiconductor substrate. The bit lines BL0, BL1, BL2, . . . are arranged in parallel to each other on a plane that is parallel to the main plane of the semiconductor substrate. Here, the bit lines BL0, BL1, BL2, . . . are positioned above the word lines WL0, WL1, WL2, . . . , three-dimensionally crossing the word lines WL0, WL1, WL2, . . . .

At the three-dimensional cross-points among the word lines WL0, WL1, WL2, . . . and the bit lines BL0, BL1, BL2, . . . , there are provided a plurality of memory cells M111, M112, M113, M121, M122, M123, M131, M132, M133 (referred to as the "memory cells M111, M112, . . . " hereafter) in a matrix.

Here, each of the memory cells M111, M112, . . . corresponds to the nonvolatile memory element 100 described in Embodiment 1. In Application 2, note that each of the memory cells M111, M112, . . . includes a current steering element as described later.

It should be noted that each of the memory cells M111, M112, . . . in FIG. 12 is shown as a nonvolatile memory element 320 in FIG. 13.

The address input circuit 309 receives an address signal from an external circuit (not illustrated). According to this address signal, the address input circuit 309 outputs a row address signal to the row selection circuit-driver 303 and also outputs a column address signal to the column selection circuit-driver 304. Here, the address signal indicates an address of a specific memory cell selected from among the memory cells M111, M112, . . . . Moreover, the row address signal indicates a row address included in the address indicated by the address signal, and the column address signal similarly indicates a column address included in the address indicated by the address signal.

In an information write cycle, the control circuit 310 outputs, to the write circuit 305, a write signal instructing an application of a write voltage according to input data "Din" received by the data input-output circuit 307. On the other hand, in an information read cycle, the control unit 310 outputs a read signal instructing a read operation, to the column selection circuit-driver 304.

Receiving the row address signal outputted from the address input circuit 309, the row selection circuit-driver 303 selects one of the word lines WL0, WL1, WL2, . . . according to the received row address signal. Then, the row selection circuit-driver 303 applies a predetermined voltage to the selected word line. The row selection circuit-driver 303 selects at least one of the memory cells M111, M112, . . . included in the memory array 302.

Receiving the column address signal outputted from the address input circuit 309, the column selection circuit-driver 304 selects one of the bit lines BL0, BL1, BL2, . . . according to the received column address signal. Then, the column selection circuit-driver 304 applies the write voltage or the read voltage the to the selected bit line. The column selection circuit-driver 304 writes data by applying the voltage to the memory cell selected by the row selection circuit-driver 303. The column selection circuit-driver 304 reads data by detecting the resistance value of the memory cell selected by the row selection circuit-driver 303.

When receiving the write signal outputted from the control circuit 310, the write circuit 305 outputs, to the row selection circuit-driver 303, a signal instructing a voltage application to the selected word line and also outputs, to the column selection circuit-driver 304, a signal instructing an application of the write voltage to the selected bit line.

Moreover, in the information read cycle, the sense amplifier 306 detects the amount of current passing through the selected bit line to be read, and then determines whether the data is "1" or "0". Output data "DO" obtained as a result of this is outputted to an external circuit via the data input-output circuit 307.

Here, it is also possible to implement a multi-layer nonvolatile memory device by three-dimensionally stacking the memory arrays included in the nonvolatile memory device in Application 2 shown in FIG. 12 and FIG. 13. With such multi-layered memory arrays, an ultra-high capacity nonvolatile memory can be implemented.

[Configuration of Nonvolatile Memory Element]

Figure 14:
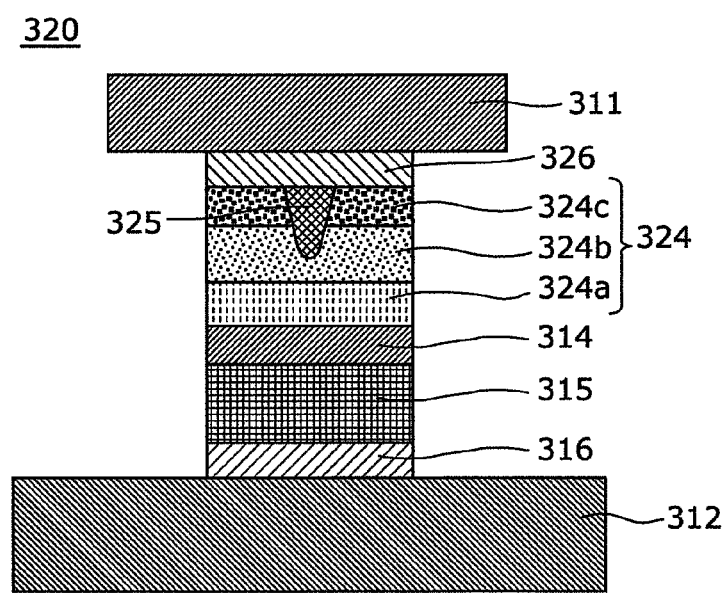
FIG. 14 is a cross-sectional diagram showing a configuration of a nonvolatile memory element included in the nonvolatile memory device in Application 2 of Embodiment 1 according to the present invention.

FIG. 14 is a cross-sectional diagram (an enlarged cross-sectional view of a unit B shown in FIG. 13) showing a configuration of the nonvolatile memory element 320 included in the nonvolatile memory device 300 in Application 2.

As shown in FIG. 14, the nonvolatile memory element 320 included in the nonvolatile memory device 300 in Application 2 is positioned between a lower line 312 (which corresponds to the word line WL1 in FIG. 13) that is a copper line and an upper line 311 (which corresponds to the bit line BL1 in FIG. 13). The nonvolatile memory element 320 includes a lower electrode 316, a current steering layer 315, an internal electrode 314, a variable resistance layer 324, and an upper electrode 326 which are stacked in this order on the lower line 312.

The variable resistance layer 324 includes a first oxide layer 324a, a second oxide layer 324b formed on the first oxide layer 324a, and a third oxide layer 324c formed on the second oxide layer 324b.

The localized region 325 is positioned in the second oxide layer 324b and the third oxide layer 324c to be in contact with the upper electrode 326 and not to be in contact with the first oxide layer 324a. The localized region 325 has a resistivity that is lower than a resistivity of the third oxide layer 324c and different from a resistivity of the second oxide layer 324b.

The upper electrode 326, the variable resistance layer 324, the localized region 325, and the internal electrode 314 correspond, respectively, to the second electrode 106, the variable resistance layer 104, the localized region 105, and the first electrode 103 included in the nonvolatile memory element 100 shown in FIG. 1 in Embodiment 1.

The internal electrode 314, the current steering layer 315, and the lower electrode 316 are included in the current steering electrode. The current steering element is a load element that is electrically connected in series with the variable resistance layer 324 via the internal electrode 314. This current steering electrode is typified by a diode, and has nonlinear current characteristics with respect to voltage. Moreover, the current steering element has a bipolar current characteristics with respect to voltage. With the application of a voltage having an amplitude equal to or larger than a predetermined threshold voltage Vf (for example, a voltage equal to or larger than +1V or a voltage equal to or smaller than −1V with respect to one of the electrodes) to the current steering element, the current steering element decreases in resistance and thus becomes conductive.

[Operation of Nonvolatile Memory Device]

Figure 15:
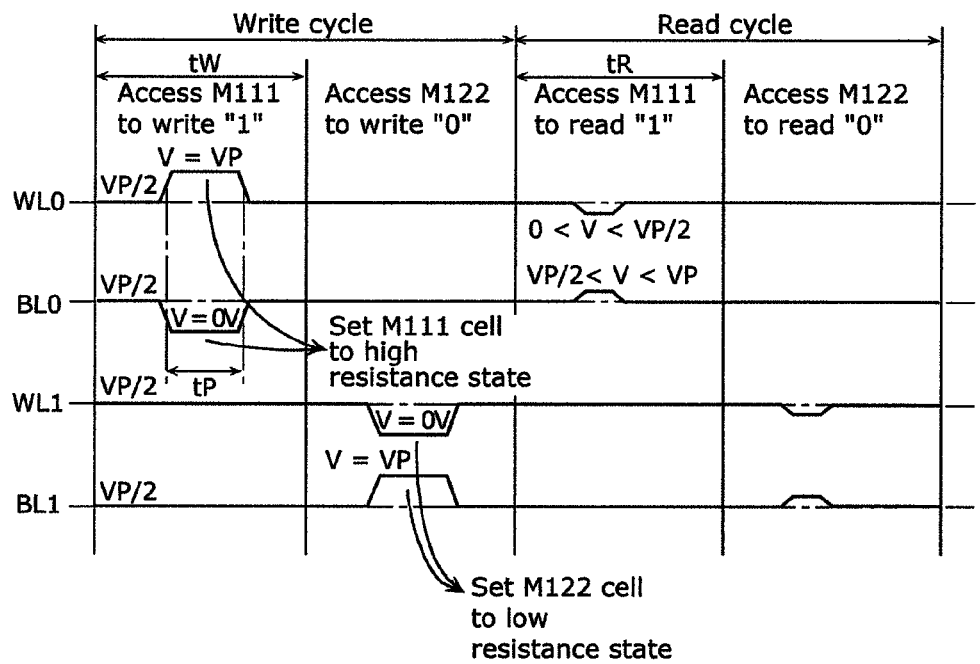
FIG. 15 is a timing diagram showing an example of an operation performed by the nonvolatile memory device in Application 2 of Embodiment 1 according to the present invention.

Next, the following describes an example of an operation performed by the nonvolatile memory device in Application 2 in the write cycle to write information and in the read cycle to read information, with reference to a timing diagram shown in FIG. 15.

FIG. 15 is a timing diagram showing an example of an operation performed by the nonvolatile memory device 300 in Application 2. It should be noted that, in the present example of the operation, information "1" is assigned to the case where the variable resistance layer 324 is in the high resistance state and information "0" is assigned to the case where the variable resistance layer 324 is in the low resistance state. Moreover, for convenience of explanation, the following describes only the case where the information is written into and read from the memory cells M111 and M122.

In FIG. 15, "VP" represents an amplitude of a pulse voltage needed for the memory element including the variable resistance element and the current steering element to change in resistance. Here, a relationship expressed by VP/2<threshold voltage Vf may be satisfied. This is because, when the voltage to be applied to a nonselected memory cell is VP/2, the current steering element of the nonselected memory cell is not brought into conduction and, therefore, a leakage current passing through the nonselected memory cell can be reduced. As a result, since an unnecessary current to be supplied to a memory cell into which no information needs to be written can be reduced, current consumption can be further reduced. Moreover, as another advantage, an unintended write operation performed on a nonselected memory cell (generally referred to as "disturb") can be reduced. The voltage VP is applied to the selected memory cell, and a relationship expressed by the threshold voltage Vf<VP is satisfied.

Moreover, in FIG. 15, "tW" represents a write cycle time required for one write cycle and "tR" represents a read cycle time required for one read cycle.

In the write cycle for the memory cell M111, the pulse voltage VP having a pulse width "tP" is applied to the word line WL0. In accordance with this timing, a voltage 0V is also applied to the bit line BL0. With this, the write voltage for writing the information "1" is applied to the memory cell M111 and, as a result, the variable resistance layer 324 of the memory cell M111 is set in the high resistance state. More specifically, the information "1" is written into the memory cell M111.

Next, in the write cycle for the memory cell M122, the voltage 0V having the pulse width tP is applied to the word line WL1. In accordance with this timing, the pulse voltage VP is also applied to the bit line BL1. With this, the write voltage for writing the information "0" is applied to the memory cell M122 and, as a result, the variable resistance layer 324 of the memory cell M122 is set in the low resistance state. More specifically, the information "0" is written into the memory cell M122.

In the read cycle for the memory cell M111, the word line WL0 is applied with a voltage that is: smaller in amplitude than the pulse applied in the read cycle; larger than 0V; and smaller than VP/2. In accordance with this timing, the bit line BL0 is applied with a voltage that is: smaller in amplitude than the pulse in the write cycle; larger than VP/2; and smaller than VP. Here, suppose that the read voltage at this time is "Vread". In this case, the memory cell M111 is applied with the read voltage Vread that satisfies a relationship expressed by the threshold voltage Vf<Vread<VP. With this, a current corresponding to the resistance value of the variable resistance layer 324 of the memory cell M111 that is in the high resistance state is outputted. As a result, by detecting this output current value, the information "1" is read.

Next, in the read cycle for the memory cell M122, the voltage which is the same as the voltage applied in the aforementioned read cycle for the memory cell M111 is applied to the word line WL1 and the bit line BL1. With this, a current corresponding to the resistance value of the variable resistance layer 324 of the memory cell M122 that is in the low resistance state is outputted. As a result, by detecting this output current value, the information "0" is read.

The nonvolatile memory device 300 in Application 2 includes the nonvolatile memory element 320 that is capable of an excellent resistance change operation. Hence, a stable operation can be implemented.

[Embodiment 2]

Figure 16:
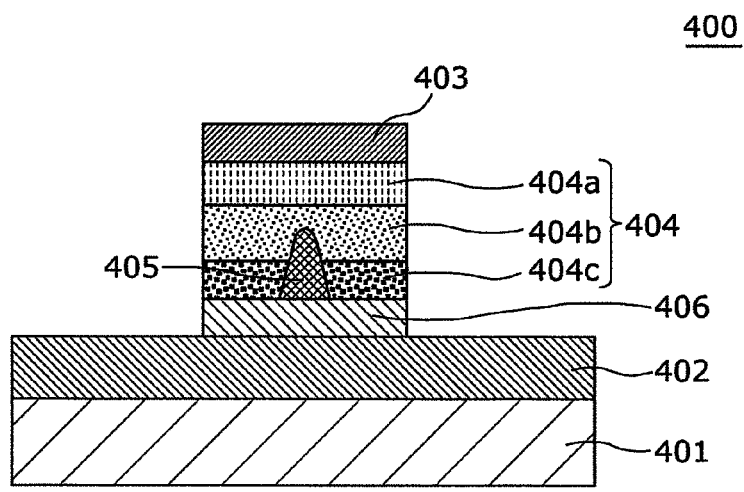
FIG. 16 is a cross-sectional diagram showing a nonvolatile memory element in Embodiment 2 according to the present invention.

FIG. 16 is a cross-sectional diagram showing an example of a configuration of a variable resistance nonvolatile memory element 400 in Embodiment 2 according to the present invention.

The nonvolatile memory element 400 shown in FIG. 16 is different from the variable resistance nonvolatile memory element 100 shown in FIG. 1 in Embodiment 1 according to the present invention in that layers included in a variable resistance layer are arranged upside down as compared with Embodiment 1 and that the positions of a first electrode and a second electrode are upside down as compared with the positions in Embodiment 1. To be more specific, although the second electrode 106 is positioned above the first electrode 103 in the nonvolatile memory element 100, a second electrode 406 is positioned below a first electrode 403 in the nonvolatile memory element 400.

The nonvolatile memory element 400 in Embodiment 2 includes a substrate 401, an interlayer dielectric 402 formed on the substrate 401, the second electrode 406 formed on the interlayer dielectric 402, the first electrode 403, a variable resistance layer 404 positioned between the first electrode 403 and the second electrode 406.

As shown in FIG. 16, the variable resistance layer 404 includes: a third oxide layer 404c, a second oxide layer 404b formed on the third oxide layer 404c; a first oxide layer 404a formed on the second oxide layer 404b; and a localized region 405 that is positioned in the second oxide layer 404b and the third oxide layer 404c to be in contact with the second electrode 406 and not to be in contact with the first oxide layer 404a.

The variable resistance layer 404 has a stacked structure including the first oxide layer 404a, the second oxide layer 404b, and the third oxide layer 404c. The first oxide layer 404a includes a first metal oxide. The second oxide layer 404b includes a second metal oxide. The third oxide layer 404c includes a third metal oxide. Moreover, a relationship among a resistivity $\rho_x$ of the first oxide layer 404a, a resistivity $\rho_y$ of the second oxide layer 404b, and a resistivity $\rho_z$ of the third oxide layer 404c is expressed by $\rho_x<\rho_y<\rho_z$. To be more specific, the first oxide layer 404a, the second oxide layer 404b, and the third oxide layer 404c in Embodiment 2 correspond, respectively, to the first oxide layer 104a, the second oxide layer 104b, and the third oxide layer 104c in Embodiment 1. Furthermore, when the resistivity of the localized region 405 is represented as $\rho_l$, the localized region 405 includes a region where $\rho_l<\rho_z$ and a region where $\rho_l \neq \rho_y$.

[Manufacturing Method and Operation of Nonvolatile Memory Element]

Next, an example of a method of manufacturing the nonvolatile memory element 400 in Embodiment 2 is described, with reference to FIG. 17A to FIG. 17D.

Figure 17A:
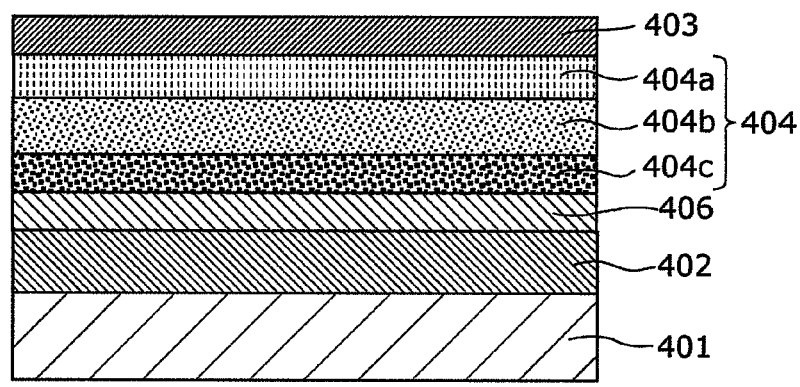
FIG. 17A is a cross-sectional diagram showing a method of manufacturing a main part of the nonvolatile memory element in Embodiment 2 according to the present invention.

Firstly, as shown in FIG. 17A, the interlayer dielectric 402 that is 200 nm in thickness is formed on the substrate 401 that is, for example, a single-crystal silicon, according to a thermal oxidation method. Then, an Ir film that is 150 nm in thickness for example is formed as the second electrode 406 on the interlayer dielectric 402, according to a sputtering method. It should be noted that a Ti adhesion layer or a TiN adhesion layer may also be formed between the second electrode 406 and the interlayer dielectric 402, according to the sputtering method. After this, the third oxide layer 404c is formed on the second electrode 406 according to a reactive sputtering method using, for example, a Ta target.

Next, the second oxide layer 404b having a lower resistivity than the third oxide layer 404c is formed on the upper surface of the third oxide layer 404c, according to the reactive sputtering method using, for example, a Ta garget.

Then, the first oxide layer 404a having a lower resistivity than the second oxide layer 404b is formed on the upper surface of the second oxide layer 404b, according to the reactive sputtering method using a Ta garget. The variable resistance layer 404 has the stacked structure in which the first oxide layer 404a, the second oxide layer 404b, and the third oxide layer 404c are stacked.

Here, when the third oxide layer 404 is too thick, an initial resistance value is too high, for example. On the other hand, when the third oxide layer 404c is too thin, a stable resistance change cannot be obtained. On this account, the thickness may be from 1 nm to 8 nm inclusive.

Next, a Ta film that is 100 nm in thickness for example is formed as the first electrode 403 on the first oxide layer 404a, according to the sputtering method.

Figure 17B:
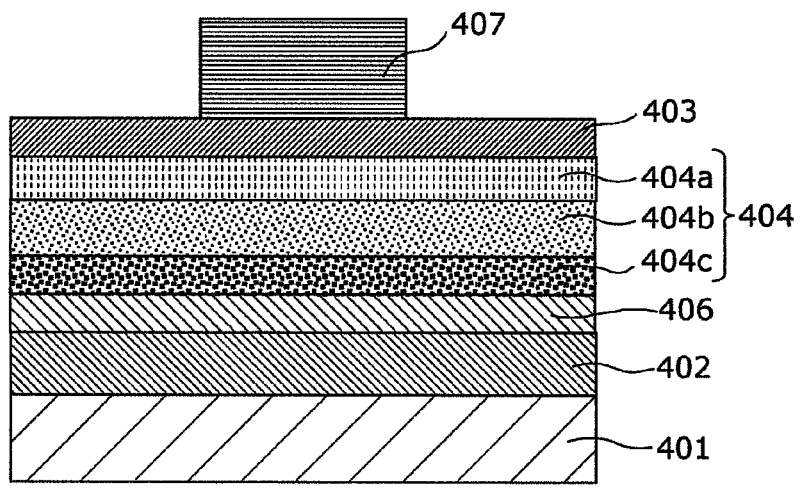
FIG. 17B is a cross-sectional diagram showing a method of manufacturing a main part of the nonvolatile memory element in Embodiment 2 according to the present invention.
Figure 17C:
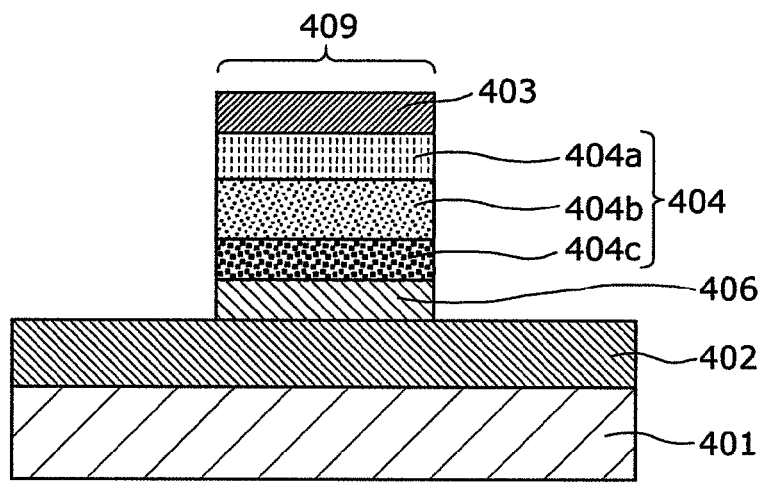
FIG. 17C is a cross-sectional diagram showing a method of manufacturing a main part of the nonvolatile memory element in Embodiment 2 according to the present invention.

Then, as shown in FIG. 17B, a pattern 407 of a photoresist is formed according to a photolithography process. After this, as shown in FIG. 17C, an element region 409 is formed according to a dry etching method using the pattern 407 as a mask.

Figure 17D:
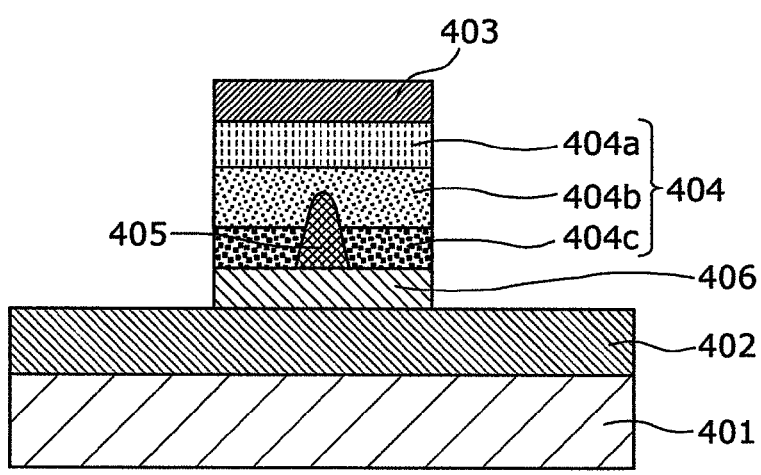
FIG. 17D is a cross-sectional diagram showing a method of manufacturing a main part of the nonvolatile memory element in Embodiment 2 according to the present invention.

Following this, as shown in FIG. 17D, the localized region 405 is formed in the variable resistance layer 404 by the application of the initial breakdown voltage between the first electrode 403 and the second electrode 406 (between the electrodes).

As described thus far, the nonvolatile memory element in Embodiment 2 allows a resistance change to occur with a low voltage and thereby can reduce the fluctuations in the variable resistance characteristics, for the same reason as in Embodiment 1.

[Embodiment 3]

Figure 18:
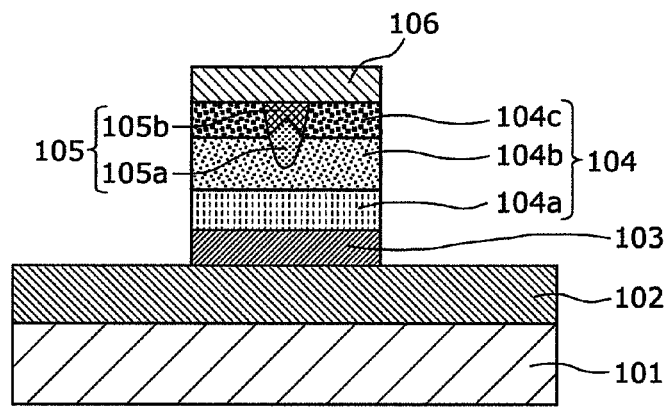
FIG. 18 is a cross-sectional diagram showing a nonvolatile memory element in Embodiment 3 according to the present invention.
Figure 19:
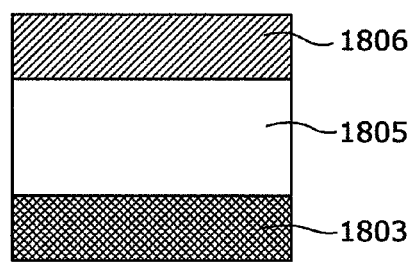
FIG. 19 is a cross-sectional diagram showing an example of a conventional nonvolatile memory element.
Figure 19:
Figure 19:
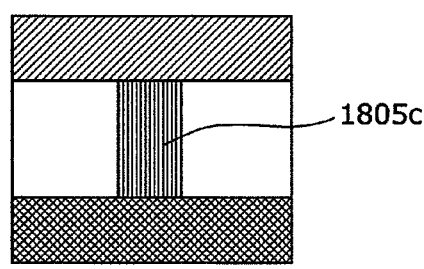

FIG. 18 is a cross-sectional diagram showing an example of a configuration of a nonvolatile memory element 500 in Embodiment 3 according to the present invention.

The nonvolatile memory element 500 shown in FIG. 18 is different from the variable resistance nonvolatile memory element 100 shown in FIG. 1 in Embodiment 1 according to the present invention in that a localized region 105 includes a first localized region 105a and a second localized region 105b.

The nonvolatile memory element 500 includes a substrate 101, an interlayer dielectric 102, a first electrode 103, a second electrode 106, and a variable resistance layer 104.

The variable resistance layer 104 includes a first oxide layer 104a, a second oxide layer 104b, a third oxide layer 104c, and the localized region 105. A relationship among a resistivity $\rho_x$ of the first oxide layer 404a, a resistivity $\rho_y$ of the second oxide layer 404b, and a resistivity $\rho_z$ of the third oxide layer 404c is expressed by $\rho_x<\rho_y<\rho_z$.

The localized region 105 includes: the first localized region 105a that is positioned in the second oxide layer 104b not to be in contact with the first oxide layer 104a and has a resistivity different from the resistivity of the second oxide layer 104b; and the second localized region 105b that is positioned in the third oxide layer 104c to be in contact with the second electrode 106 and has a resistivity lower than the resistivity of the third oxide layer 104c. The second localized region 105b is positioned between the first localized region 105a and the second electrode 106 to be in contact with the first localized region 105a and the second electrode 106.

Suppose that the resistivity of the first localized region 105a is $\rho_{l1}$ and that the resistivity of the second localized region 105b is $\rho_{l2}$. In this case, a relationship expressed by $\rho_{l1}<\rho_{l2}<\rho_z$ and $\rho_{l1} \neq \rho_y$, or more specifically, a relationship expressed by, for example, $\rho_{l1}<\rho_z$ is satisfied. This resistivity relationship is implemented when: the variable resistance layer 104 comprises a metal oxide having a non-stoichiometric composition including a p-type carrier; the first localized region 105a is different from the second oxide layer 104b in the oxygen content atomic percentage, or more specifically, the first localized region 105a is higher than the second oxide layer 104b in the oxygen content atomic percentage; and the second localized region 105b is higher than the third oxide layer 104c in the oxygen content atomic percentage. On the other hand, the resistivity relationship is implemented when: the variable resistance layer 104 comprises a metal oxide having a non-stoichiometric composition including an n-type carrier; the first localized region 105a is different from the second oxide layer 104b in the oxygen content atomic percentage, or more specifically, the first localized region 105a is lower than the second oxide layer 104b in the oxygen content atomic percentage; and the second localized region 105b is lower than the third oxide layer 104c in the oxygen content atomic percentage.

As described thus far, the nonvolatile memory element in Embodiment 3 allows a resistance change to occur with a low voltage and thereby can reduce the fluctuations in the variable resistance characteristics, for the same reason as in Embodiment 1.

Although the nonvolatile memory element and the nonvolatile memory device according to the present invention have been described by way of Embodiments described above, the present invention is not limited to Embodiments described above. It is to be noted that various changes and modifications will be apparent to those skilled in the art. Therefore, unless such changes and modifications depart from the scope of the present invention, they should be construed as being included therein. Moreover, any structural elements in Embodiments described above may be combined unless such combinations depart from the spirit of the present invention.

For example, the method of manufacturing the nonvolatile memory element in Embodiments above is not limited to Embodiments above. To be more specific, for electronic devices in general having variable resistance elements, the nonvolatile memory element in Embodiments above can be manufactured by the above manufacturing method or a method in which the above manufacturing method and a publicly known method are combined.

Moreover, in Embodiments above, each of the layers of the stacked structure may be filled in a contact hall.

Furthermore, in Embodiments above, a plurality of localized regions 105 may be formed in one nonvolatile memory element 100.

Moreover, in Embodiments above, the plate lines are arranged in parallel to the word lines. However, the plate lines may be arranged in parallel to the bit lines. Furthermore, the plate line applies the same voltage to the transistors. However, a plate line selection circuit-driver having the same configuration as the row selection circuit-driver may be provided. Then, each of the selected plate line and the nonselected plate line may be driven by a different voltage (the polarity may also be different).

[Industrial Applicability]

The present invention is useful as a nonvolatile memory element and a'nonvolatile memory device. In particular, the present invention is useful as a memory element, a memory device, and the like used in various kinds of electronic apparatuses, such as a home-use digital electrical apparatus, a memory card, a personal computer, and a mobile phone.

[Reference Signs List]
100, 220, 320, 400, 500, 1800 Nonvolatile memory element
101, 211, 401 Substrate
102 Interlayer dielectric
103, 403, 1803 First electrode
104, 224, 324, 404, 1805 Variable resistance layer
104a, 224a, 324a, 404a First oxide layer
104b, 224b, 324b, 404b Second oxide layer
104c, 224c, 324c, 404c Third oxide layer
105, 225, 325, 405 Localized region
105a First localized region
105b Second localized region
106, 406, 1806 Second electrode
107, 407 Pattern
109, 409 Element region
200, 300 Nonvolatile memory device
201, 301 Memory main unit
202, 302 Memory array
203, 303 Row selection circuit-driver
204, 304 Column selection circuit-driver
205, 305 Write circuit
206, 306 Sense amplifier
207, 307 Data input-output circuit
208 VCP power supply
209, 309 Address input circuit
210, 310 Control circuit
217 Plug layer
218 Metal wiring layer
219 Source/drain region
223, 316 Lower electrode
226, 326 Upper electrode
311 Upper line
312 Lower line
314 Internal electrode
315 Current steering layer
402 Interlayer dielectric
1805c Filaments
BL0, Bl1, . . . Bit line
T11, T12, . . . Transistor
M111, M112, . . . Memory cell
M11, M12, . . . Memory cell
SL0, SL2, . . . Plate line
WL0, W11, . . . Word line

The invention claimed is:

1. A variable resistance nonvolatile memory element comprising:
a first electrode;
a second electrode; and
a variable resistance layer which comprises a metal oxide positioned between the first electrode and the second electrode, the metal oxide having a resistance state that reversibly changes between a high resistance state and a low resistance state according to a polarity of a voltage pulse applied between the first electrode and the second electrode,
wherein the variable resistance layer includes:
a first metal oxide layer which is positioned on the first electrode, and has a resistivity $\rho_x$ and a composition that is expressed by $MO_X$ where M represents a metal element;
a second metal oxide layer which is positioned on the first metal oxide layer, and has a resistivity $\rho_y$ where $\rho_x < \rho_y$, and a composition expressed by $NO_y$ where N represents a metal element;
a third metal oxide layer which is positioned on the second metal oxide layer, and has a resistivity $\rho_z$ where $\rho_y < \rho_z$ and a composition expressed by $PO_z$ where P represents a metal element; and
a localized region which is positioned in the third metal oxide layer and the second metal oxide layer to be in contact with the second electrode and not to be in contact with the first metal oxide layer, and has a resistivity that is lower than the resistivity of the third metal oxide layer and different from the resistivity of the second metal oxide layer.

2. The variable resistance nonvolatile memory element according to claim 1,
wherein the second metal oxide layer and the first metal oxide layer comprise metal oxides of the same kind.

3. The variable resistance nonvolatile memory element according to claim 1,
wherein the third metal oxide layer and the first metal oxide layer comprise metal oxides of the same kind.

4. The variable resistance nonvolatile memory element according to claim 1,
wherein the third metal oxide layer and the second metal oxide layer comprise metal oxides of the same kind.

5. The variable resistance nonvolatile memory element according to claim 1,
wherein the third metal oxide layer, the second metal oxide layer, and the first metal oxide layer comprise metal oxides of the same kind.

6. The variable resistance nonvolatile memory element according to claim 1,
wherein the third metal oxide layer, the second metal oxide layer, and the first metal oxide layer comprise metal oxides of different kinds.

7. The variable resistance nonvolatile memory element according to claim 1,
wherein each metal oxide included in the third metal oxide layer, the second metal oxide layer, and the first metal oxide layer comprises an element selected from a group including tantalum, hafnium, zirconium, and aluminum.

8. The variable resistance nonvolatile memory element according to claim 1,
wherein the localized region comprises a metal oxide including the metal element P.

9. The variable resistance nonvolatile memory element according to claim 1,
wherein the first electrode and the second electrode comprise a same material.

10. The variable resistance nonvolatile memory element according to claim 1, further comprising
a load element which is electrically connected to the variable resistance layer.

11. The variable resistance nonvolatile memory element according to claim 10,
wherein the load element is one of a fixed resistor, a transistor, and a diode.

12. The variable resistance nonvolatile memory element according to claim 1,
wherein the localized region is formed in the variable resistance layer on a one-to-one basis.

13. The variable resistance nonvolatile memory element according to claim 1,
wherein the localized region includes:
a first localized region which is positioned to be in contact with the second metal oxide layer and not to be in contact with the first metal oxide layer, and has a resistivity different from the resistivity of the second metal oxide layer; and
a second localized region which has one end positioned to be in contact with the second electrode and an other end positioned to be in contact with the first localized region, and has a resistivity lower than the resistivity of the third metal oxide and higher than the resistivity of the first localized region.

14. A nonvolatile memory device comprising:
a memory cell array including (i) a substrate, (ii) first lines which are formed in parallel to each other on the substrate, (iii) second lines which are formed in parallel to each other on a plane parallel to a main plane of the substrate, and are positioned above the first lines to three-dimensionally cross the first lines, and (iv) a plurality of the nonvolatile memory elements according to claim 1 arranged at three-dimensional cross-points of the first lines and the second lines;
a selection circuit which selects at least one of the nonvolatile memory elements included in the memory cell array;
a write circuit which writes data by applying a voltage to the nonvolatile memory element selected by the selection circuit; and
a read circuit which reads data by detecting a resistance value of the nonvolatile memory element selected by the selection circuit.

15. The nonvolatile memory device according to claim 14,
wherein the nonvolatile memory element includes a current steering element which is electrically connected to the variable resistance layer.

16. A nonvolatile memory device comprising:
a memory cell array including (i) a substrate, (ii) word lines and bit lines which are formed on the substrate, (iii) transistors each of which is connected to a corresponding one of the word lines and to a corresponding one of the bit lines; and (iv) a plurality of the nonvolatile memory elements according to claim 1 provided for the transistors on a one-to-one basis;
a selection circuit which selects at least one of the nonvolatile memory elements included in the memory cell array;
a write circuit which writes data by applying a voltage to the nonvolatile memory element selected by the selection circuit; and
a read circuit which reads data by detecting a resistance value of the nonvolatile memory element selected by the selection circuit.

* * * * *